United States Patent
Tsorng et al.

(10) Patent No.: US 11,839,041 B1
(45) Date of Patent: Dec. 5, 2023

(54) LOW-PROFILE RETRACTABLE HANDLE ASSEMBLY

(71) Applicant: Quanta Computer Inc., Taoyuan (TW)

(72) Inventors: Yaw-Tzorng Tsorng, Taoyuan (TW); Tung-Hsien Wu, Taoyuan (TW); Yu-Ying Tseng, Taoyuan (TW); Hsiang-Pu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/819,389

(22) Filed: Aug. 12, 2022

(51) Int. Cl.
*H05K 5/02* (2006.01)
*H05K 7/14* (2006.01)

(52) U.S. Cl.
CPC ............ *H05K 5/023* (2013.01); *H05K 7/14* (2013.01)

(58) Field of Classification Search
CPC ........ H05K 5/023; H05K 5/0221; H05K 7/14; H05K 7/1485; H05K 7/1487; G06F 1/185; G06F 1/186; G06F 1/187; G06F 1/188
See application file for complete search history.

(56) References Cited

U.S. PATENT DOCUMENTS

| | | | | |
|---|---|---|---|---|
| 2007/0223204 A1* | 9/2007 | Makabe | .................. | H05K 5/023 361/756 |
| 2008/0117603 A1* | 5/2008 | Henry | .................. | H05K 7/1409 361/740 |
| 2014/0354127 A1* | 12/2014 | Huang | .................... | H05K 5/023 16/110.1 |
| 2015/0195946 A1* | 7/2015 | Kelaher | ............... | H05K 7/1488 312/244 |
| 2016/0064040 A1* | 3/2016 | Hartman | .............. | H05K 7/1402 360/97.12 |

* cited by examiner

*Primary Examiner* — James Wu
*Assistant Examiner* — Christopher L Augustin
(74) *Attorney, Agent, or Firm* — NIXON PEABODY LLP

(57) ABSTRACT

A retractable handle assembly for an electronic device includes a base plate having a base plane, a sliding member, and a handle. The sliding member is movable along a first axis that is parallel to the base plane. The handle is movable along a second axis that is perpendicular to the base plane. The sliding member has a ramp surface and a wedge surface. The handle has a mating wedge surface. The ramp surface and the wedge surface are angularly oriented relative to the base plane. The ramp surface is angled to receive a first force, which is perpendicular relative to and directed towards the base plane. In response to the first force, the sliding member moves along the first axis and the wedge surface moves towards the mating wedge surface. The wedge surface moving towards the mating wedge surface causes a second force to deploy.

20 Claims, 17 Drawing Sheets

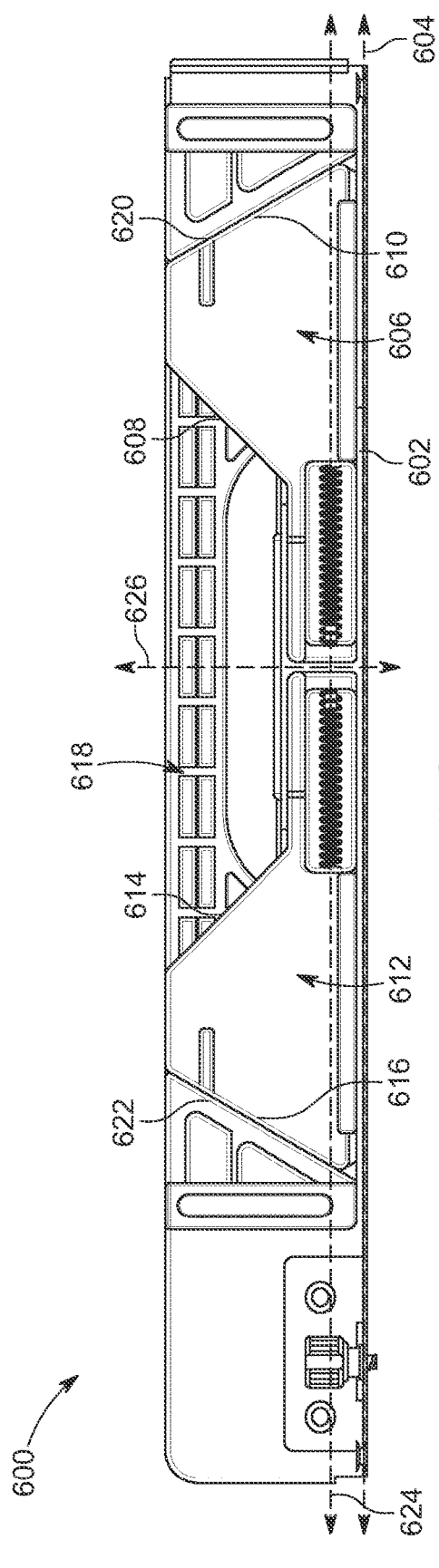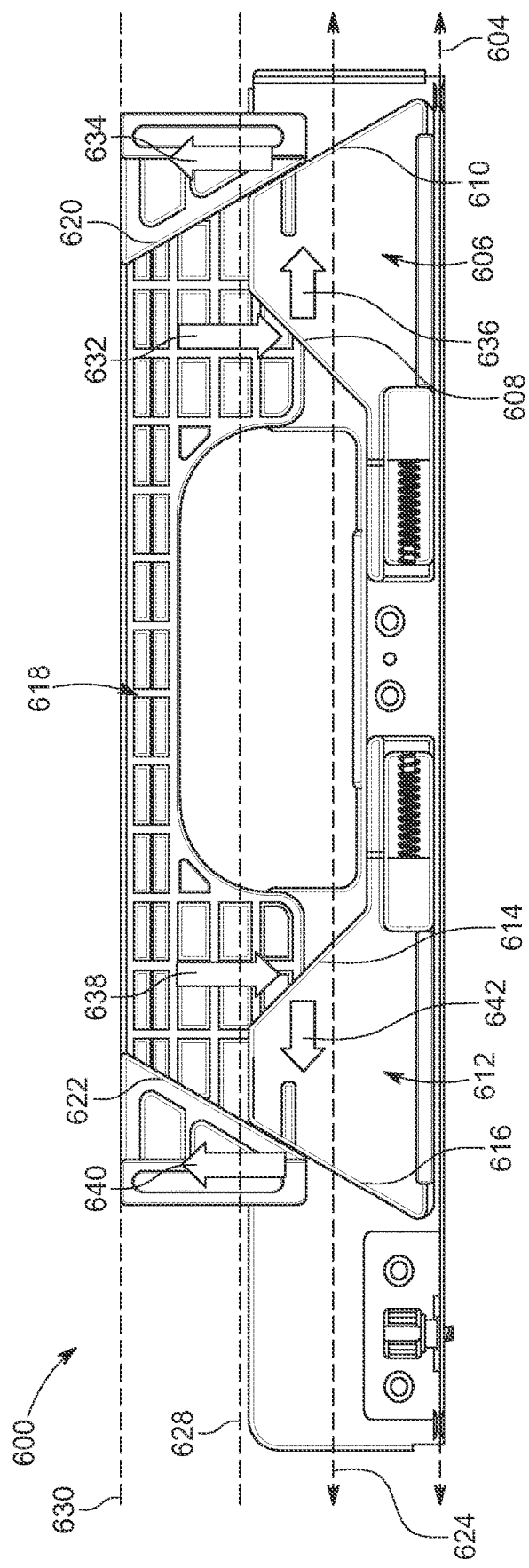
FIG. 6A
FIG. 6B

LOW-PROFILE RETRACTABLE HANDLE ASSEMBLY

FIELD OF THE INVENTION

The present invention relates generally to an apparatus for an electronic system, and more specifically, to a retractable handle assembly for an electronic system.

BACKGROUND OF THE INVENTION

Internal space in computer systems, such as electronic chassis, comes at a premium. For this reason, user operating space is often sacrificed in order to accommodate additional server components. The lack of sufficient user operating space may render the computer system difficult to service and also increases the risk of mishandling and inadvertently damaging the delicate and expensive components during handling. This concern is particularly acute for electronic devices that use liquid-cooling cold plates for heat dissipation. Such electronic devices have liquid-carrying conduits that run between delicate and expensive electronic components. Attempting to service the electronic chassis in confined operating space risks damaging the conduits and causing a leak that could damage the electronic components. Thus, what is needed is a retractable handle assembly that can provide additional user operating space when deployed.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a retractable handle assembly includes a base plate, a first sliding member, and a handle. The base plate defines a base plane. The first sliding member is movable along a first axis that is parallel to the base plane. The handle is movable along a second axis that is perpendicular to the base plane. The first sliding member has a first ramp surface and a first wedge surface. The handle has a first mating wedge surface. Each of the first ramp surface and the first wedge surface is angularly oriented relative to the base plane. The first ramp surface is angled to receive a first force, which is angled perpendicularly relative to and towards the base plane. In response to the first force, the first sliding member moves along the first axis and the first wedge surface moves towards the first mating wedge surface of the handle. Movement of the first wedge surface towards the first mating wedge surface causes a second force to deploy the handle by moving the handle from a closed position to an open position.

According to another aspect of the retractable handle assembly described above, the first sliding member further includes a second wedge surface and the handle further includes a second mating wedge surface. In response to the first force, the second wedge surface is moves towards the second mating wedge surface. Movement of the second wedge surface towards the second mating wedge surface causes a fourth force to deploy the handle by moving the handle from the closed position to the open position.

According to another aspect of the retractable handle assembly described above, movement of the first wedge surface towards the first mating wedge surface exerts a third force on the first mating wedge surface along the first axis. The third force causes the second force. Furthermore, movement of the second wedge surface towards the second mating wedge surface exerts a fifth force on the second mating wedge surface along the first axis. The fifth force causes the fourth force.

According to another aspect of the retractable handle assembly described above, the retractable handle assembly further includes a first reset spring. The first reset spring has a first end coupled to the sliding member and a second end coupled to the base plate. The first reset spring provides a first spring force opposite at least one of the third force and the fifth force.

According to another aspect of the retractable handle assembly described above, instead of a sliding member with two wedge surfaces, the retractable handle assembly may include a first sliding member and a second sliding member. The first sliding member and the second sliding member are movable along the first axis. The first sliding member has a first ramp surface and a first wedge surface. The second sliding member has a second ramp surface and a second wedge surface. Each of the first ramp surface, the second ramp surface, the first wedge surface, and the second wedge surface is angularly oriented relative to the base plane. The first ramp surface is angled to receive a first force. The second ramp surface is angled to receive a fourth force. The first force and the fourth force are angled perpendicularly relative to and towards the base plane. In response to the first force, the first sliding member moves along the first axis and the first wedge surface moves towards the first mating wedge surface of the handle. In response to the fourth force, the second sliding member moves along the first axis and the second wedge surface moves towards the second mating wedge surface of the handle. Movement of the first wedge surface towards the first mating wedge surface causes a second force. Movement of the second wedge surface towards the second mating wedge surface causes a fifth force. The second force and the fifth deploy the handle by moving the handle from the closed position to the open position.

According to another aspect of the retractable handle assembly described above, movement of the second wedge surface towards the second mating wedge surface exerts a sixth force on the second mating wedge surface along the first axis. The sixth force causes the fifth force.

According to another aspect of the retractable handle assembly described above, the retractable handle assembly further includes a handle guide. The handle guide has a first guide member and a second guide member. The first guide member is attached to the handle and engages with the second guide member to restrict the handle to movement along the second axis.

According to another aspect of the retractable handle assembly described above, the first guide member has a guide track that is attached to the handle and extends parallel to the second axis. The second guide member has a guide pin protruding towards the guide track. The guide track retains the guide pin therein, allowing the guide track to slide relative to the guide pin.

According to another aspect of the retractable handle assembly described above, the retractable handle assembly further includes a cover that extends at least in part parallel to the first axis. The cover has a recess that extends towards the base plane. The recess is adapted to receive a weight-bearing member for generating the first force.

According to another aspect of the retractable handle assembly described above, the recess of the cover is configured to align the weight-bearing member with the first ramp surface of the first sliding member.

According to another aspect of the retractable handle assembly described above, the cover encloses at least part of the handle when the handle is in the closed position.

According to another aspect of the retractable handle assembly described above, the retractable handle assembly further includes a second reset spring that has a first end coupled to the handle and a second end coupled to the base plate. The second reset spring provides a second spring force opposite to the second force.

According to another aspect of the retractable handle assembly described above, the first wedge surface of the first sliding member has an angle relative to the base plane of about 45 degrees to about 60 degrees.

According to another aspect of the retractable handle assembly described above, the first ramp surface of the first sliding member has an angle relative to the base plane of about 45 degrees to about 60 degrees.

According to another aspect of the retractable handle assembly described above, the first sliding member is movable between an initial position and an engaged position and the handle is movable between a closed position and an open position. The first wedge surface has an angle relative to the base plane, the angle being a function of the cotangent of a vertical distance divided by a horizontal distance. The vertical distance is a distance traveled by the handle between the closed position and the open position. The horizontal distance is a distance traveled by the sliding member between the initial position and the engaged position.

According to another aspect of the retractable handle assembly described above, the retractable handle assembly has an open height of between about 18 millimeters to about 35 millimeters.

According to another aspect of the retractable handle assembly described above, a handle loop of the handle has a height of between about 8 millimeters and about 25 millimeters.

According to other aspects of the present disclosure, a chassis system includes a chassis and a retractable handle assembly. The retractable handle assembly includes a base plate, a first sliding member, and a handle. The base plate defines a base plane. The first sliding member is movable along a first axis that is parallel to the base plane. The handle is movable along a second axis that is perpendicular to the base plane. The first sliding member has a first ramp surface and a first wedge surface. The handle has a first mating wedge surface. Each of the first ramp surface and the first wedge surface is angularly oriented relative to the base plane. The first ramp surface is angled to receive a first force, which is angled perpendicularly relative to and towards the base plane. In response to the first force, the first sliding member moves along the first axis and the first wedge surface moves towards the first mating wedge surface of the handle. Movement of the first wedge surface towards the first mating wedge surface causes a second force to deploy the handle by moving the handle from a closed position to an open position.

According to another aspect of the chassis system described above, the chassis system further includes an electronic device detachably positioned in the chassis. The electronic device has a weight-bearing member adapted to couple to the retractable handle assembly and generate the first force.

According to another aspect of the chassis system described above, the weight-bearing member of the electronic device includes a shaft pin. The retractable handle assembly further includes a cover that extends at least in part parallel to the first axis. The cover includes a recess adapted to receive the shaft pin.

According to another aspect of the chassis system described above, the electronic device includes a graphics processing unit (GPU).

According to another aspect of the chassis system described above, the retractable handle assembly has a closed height when the handle is in the closed position. The closed height does not exceed the chassis interior height.

According to other aspects of the present disclosure, a method includes providing a retractable handle assembly detachably positioned in the system chassis. The retractable handle assembly includes a base plate, a sliding member, and a handle. The base plate defines a base plane. The sliding member is movable along a first axis that is parallel to the base plane. The handle is movable along a second axis that is perpendicular to the base plane. The sliding member has a ramp surface and a wedge surface. The handle has a mating wedge surface. Each of the ramp surface and the wedge surface is angularly oriented relative to the base plane. The ramp surface is angled to receive a first force, which is angled perpendicularly relative to and towards the base plane. In response to the first force, the sliding member moves along the first axis and the wedge surface moves towards the mating wedge surface of the handle. Movement of the wedge surface towards the mating wedge surface causes a second force to deploy the handle by moving the handle from a closed position to an open position. The method also includes deploying the handle by exerting the first force against the ramp surface, the first force being provided by weight of the electronic device. The method further includes lifting the handle to disassemble the retractable handle assembly and the electronic device from the system chassis.

According to another aspect of the method, deploying the handle includes disconnecting the electronic device from a motherboard of the electronic chassis. Deploying the handle also includes aligning the weight-bearing member of the electronic device with the ramp surface of the sliding member. Deploying the handle further includes providing the first force by exerting, via the weight-bearing member, weight of the electronic device against the ramp surface of the sliding member to cause the handle of the retractable handle assembly to move from a closed position to an open position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 6A is a left side view of a retractable handle assembly with two sliding members, according to some embodiments.

FIG. 6B is a left side view of the retractable handle assembly of FIG. 6A with the handle in the open position.

Figure 1:
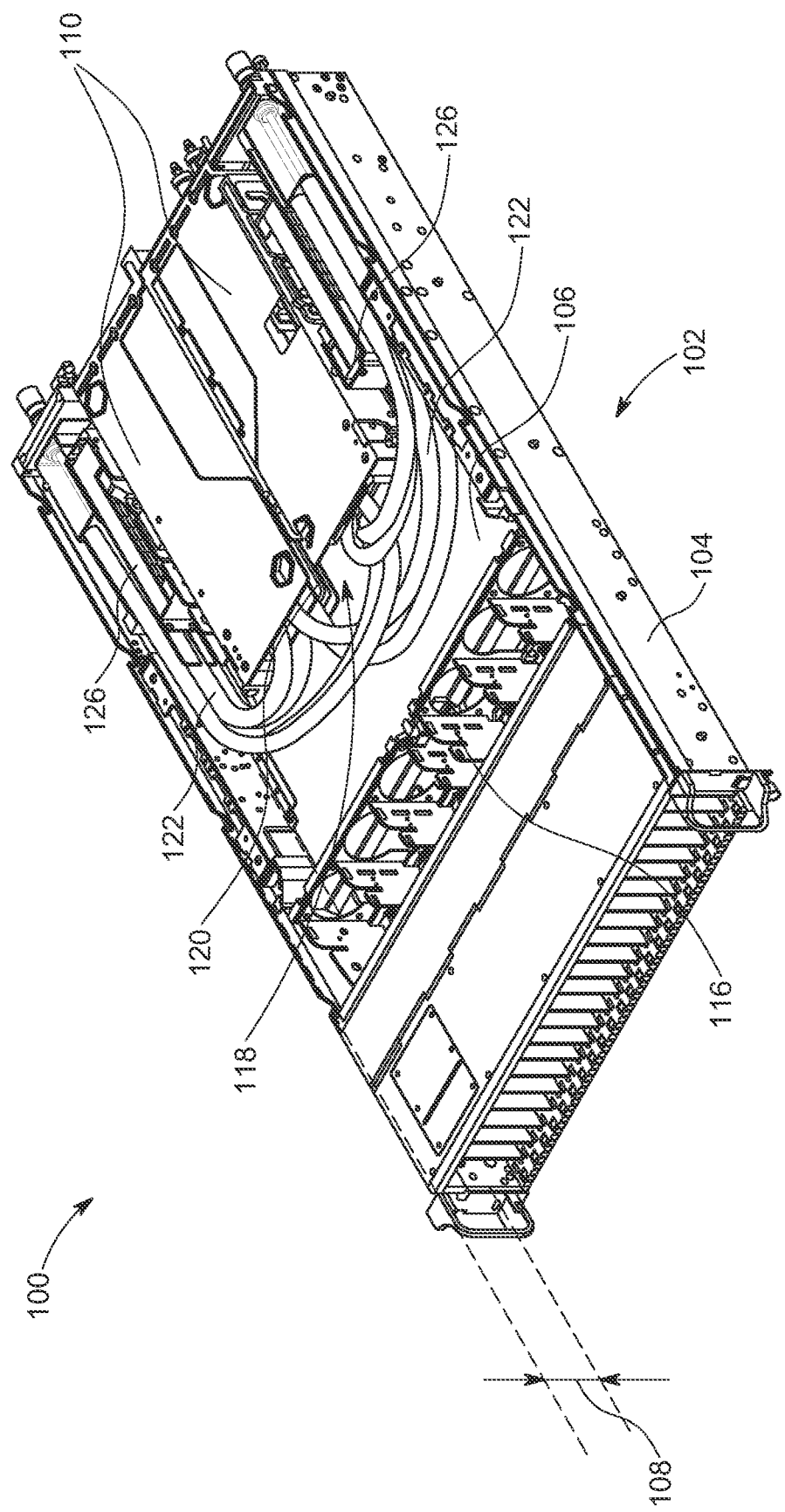
FIG. 1 is a perspective view illustrating the internal aspects of a chassis system, according to some embodiments.

Elements in the figures are illustrated for simplicity and clarity and have not necessarily been drawn to scale. For example, the dimensions and/or relative positioning of some of the elements in the figures may be exaggerated relative to other elements to help improve understanding of various features.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Generally, an embodiment of the present invention is directed to a retractable handle assembly for an electronic system that includes a base plate, a sliding member, and a handle. The base plate defines a base plane. The sliding member is movable along a first axis that is parallel to the base plane. The handle is movable along a second axis that is perpendicular to the base plane. The sliding member has a ramp surface and a wedge surface. The handle has a mating wedge surface. Each of the ramp surface and the wedge surface is angularly oriented relative to the base plane. The ramp surface is angled to receive a first force, which is angled perpendicularly relative to and towards the base plane. In response to the first force, the sliding member moves along the first axis, causing the wedge surface to move towards the mating wedge surface of the handle. Movement of the wedge surface towards the mating wedge surface causes a second force to deploy the handle by moving the handle from a closed position to an open position.

The present invention also discloses a chassis system that includes one or more of the above-described retractable handle assembly and a method for disassembling an electronic device from an electronic chassis using the above-described retractable handle assembly.

FIG. 1 shows a chassis system 100. The chassis system 100 may have one or more retractable handle assemblies 126 positioned in a chassis 102. According to some embodiments, the chassis system 100 may include a chassis 102, one or more electronic devices 110, and one or more retractable handle assemblies 126. The chassis has chassis walls 104 and a lower panel 106 that define an interior chassis height 108. In some embodiments, the lower panel 106 may be the bottom panel for the chassis 102. In other embodiments, the lower panel 106 may be a mezzanine layer or a functional component of the chassis system 100 that acts as a mezzanine layer. For instance, FIG. 1 shows that the lower panel 106 could be a water collecting tray, onto which the retractable handle assemblies 126 could be attached.

According to some embodiments, the electronic device 110 may include one or more graphics processing units (GPU). However, the electronic device 110 may be other devices as well, such as chipset, electronic circuit, server, computer, switch, router, storage device, telecommunication component and the like. To reduce working temperature of the electronic device 110 and/or other components, the chassis system 100 may further include one or more cooling systems. For instance, the exemplary chassis system 100 in FIG. 1 has a fan system 116 and a liquid cooling system 118. According to some embodiments, the liquid cooling system 118 may include a cold plate module 120 and a complement of conduits 122 for circulating a fluid coolant through the cold plate module 120. The electronic device 110 is placed in thermal contact with the cold plate module 120 to facilitate heat dissipation. As shown in FIG. 1, the retractable handle assemblies 126 may deploy a pair of handles in a first direction (e.g., upwards). This feature gives a user additional operating space in an otherwise compactly configured chassis. To ensure that the retractable handle assembly 126 does not impede stacking other chassis or equipment on top of the chassis system 100, the retractable handle assembly 126 would preferably have a closed height less than the interior chassis height 108. According to additional embodiments, as will be described below, the retractable handle assembly 126 may further include a safety feature that requires the user to physically disconnect the electronic device 110 (such as from a motherboard) before the retractable handle assembly 126 can be deployed. With the additional operating space and the safety feature provided by the retractable handle assembly 126, one is able to reduce the risk of accidentally damaging the conduits 122 and cause a leak that could damage the electronic device 110 and other components of the chassis system 100.

Figure 2A:
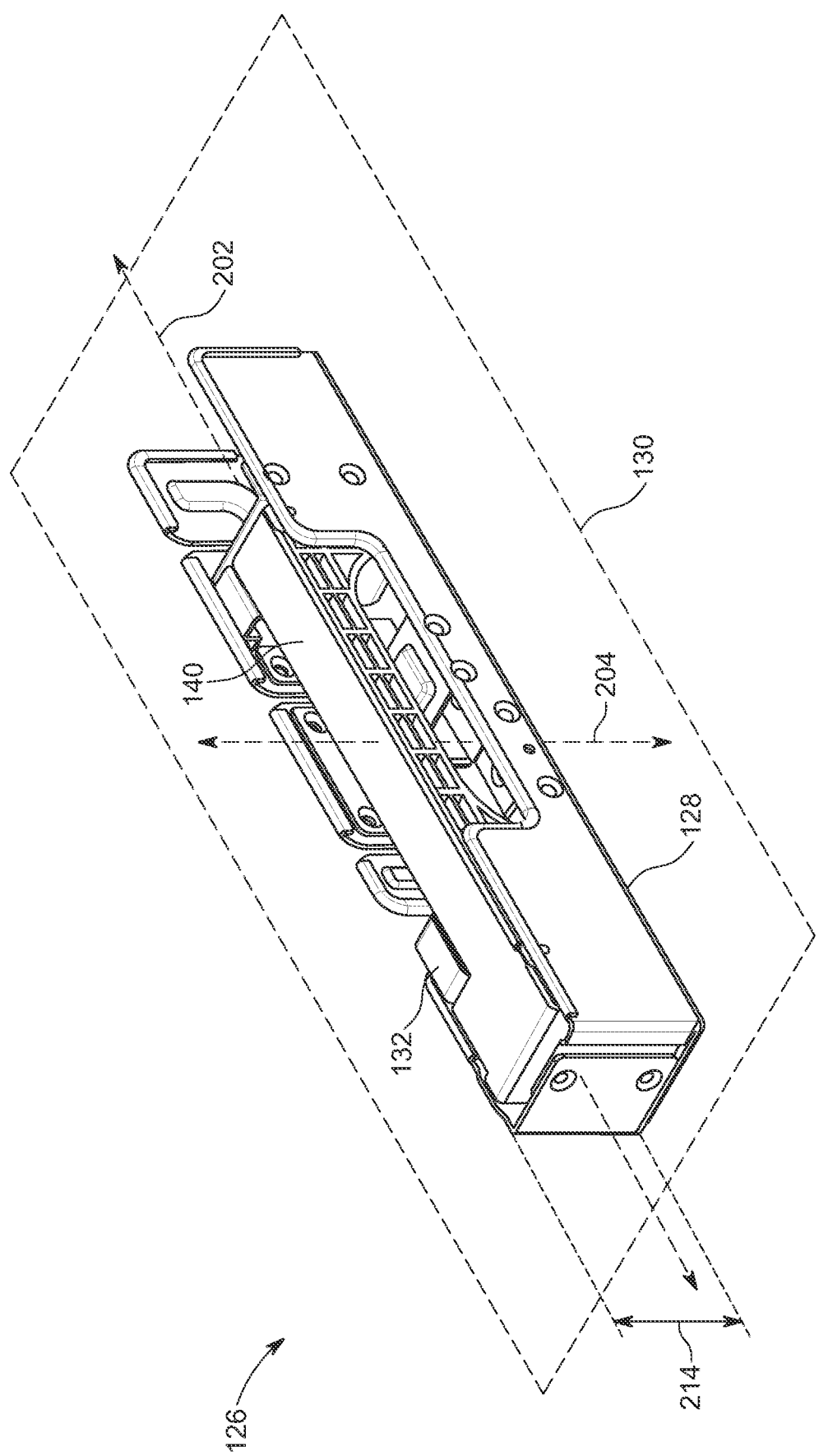
FIG. 2A is a perspective view of a retractable handle assembly, according to some embodiments.

FIGS. 2A through 2D show an embodiment of the retractable handle assembly 126. Referring to FIG. 2A, the retractable handle assembly 126 has a base plate 128, a sliding member 132, and a handle 140. The base plate 128 defines a base plane 130. The sliding member 132 is movable along a first axis 202 that is parallel to the base plane 130. The handle 140 is movable along a second axis 204 that is perpendicular to the base plane 130. According to some embodiments, the first axis 202 and the second axis 204 correspond to a horizontal axis and a vertical axis, respectively. When the handle 140 is closed, the retractable handle assembly 126 has a closed height 214.

Figure 2B:
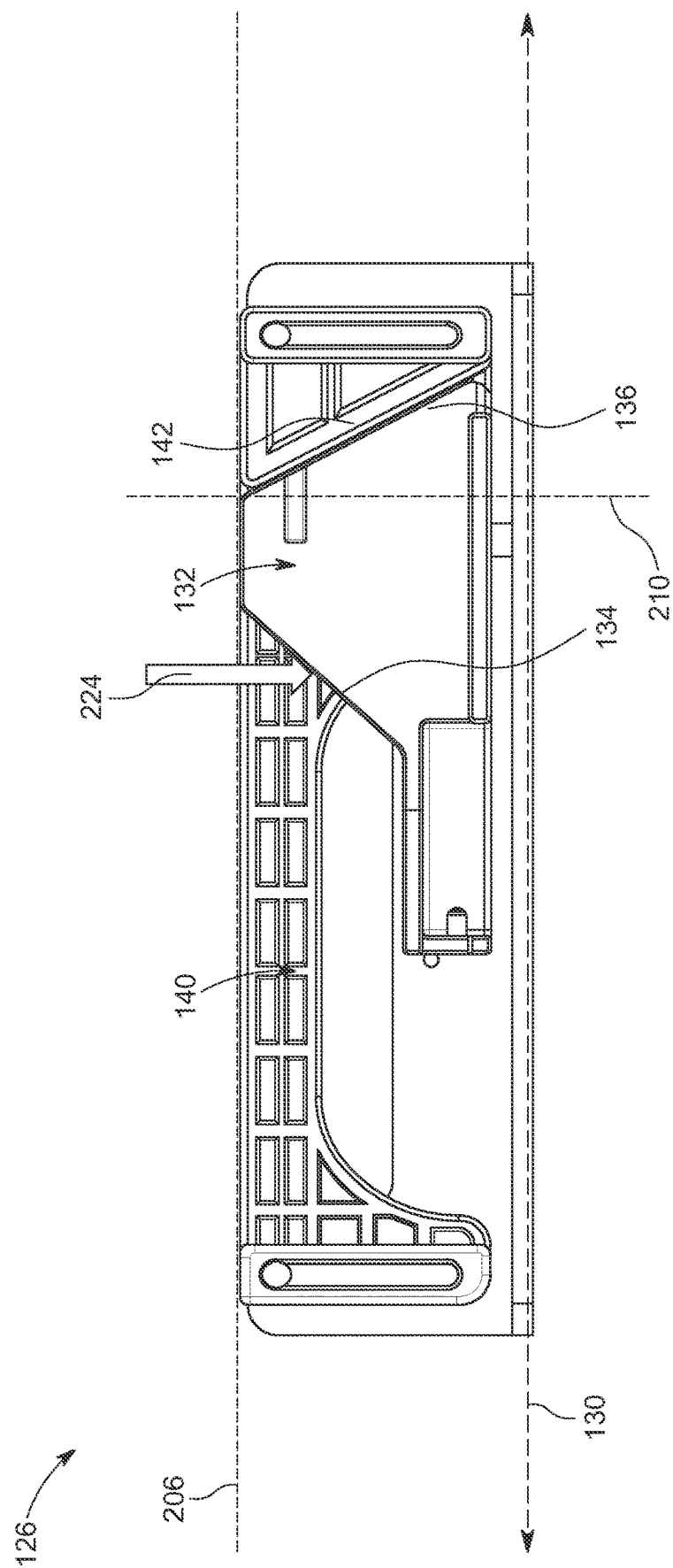
FIG. 2B is a left side view of the retractable handle assembly of FIG. 2A when the handle is in the closed position.

Referring to FIG. 2B, a side view of the retractable handle assembly 126 of FIG. 2A from the left shows its internal aspects. The sliding member 132 starts at an initial position 210 and the handle 140 starts at a closed position 206. The sliding member 132 has a ramp surface 134 and a wedge surface 136. The handle 140 has a mating wedge surface 142 that is positioned opposite the wedge surface 136. Each of the ramp surface 134 and the wedge surface 136 of the sliding member 132 is angularly oriented relative to the base plane 130. Furthermore, the ramp surface 134 is angled to receive a first force 224.

Figure 2C:
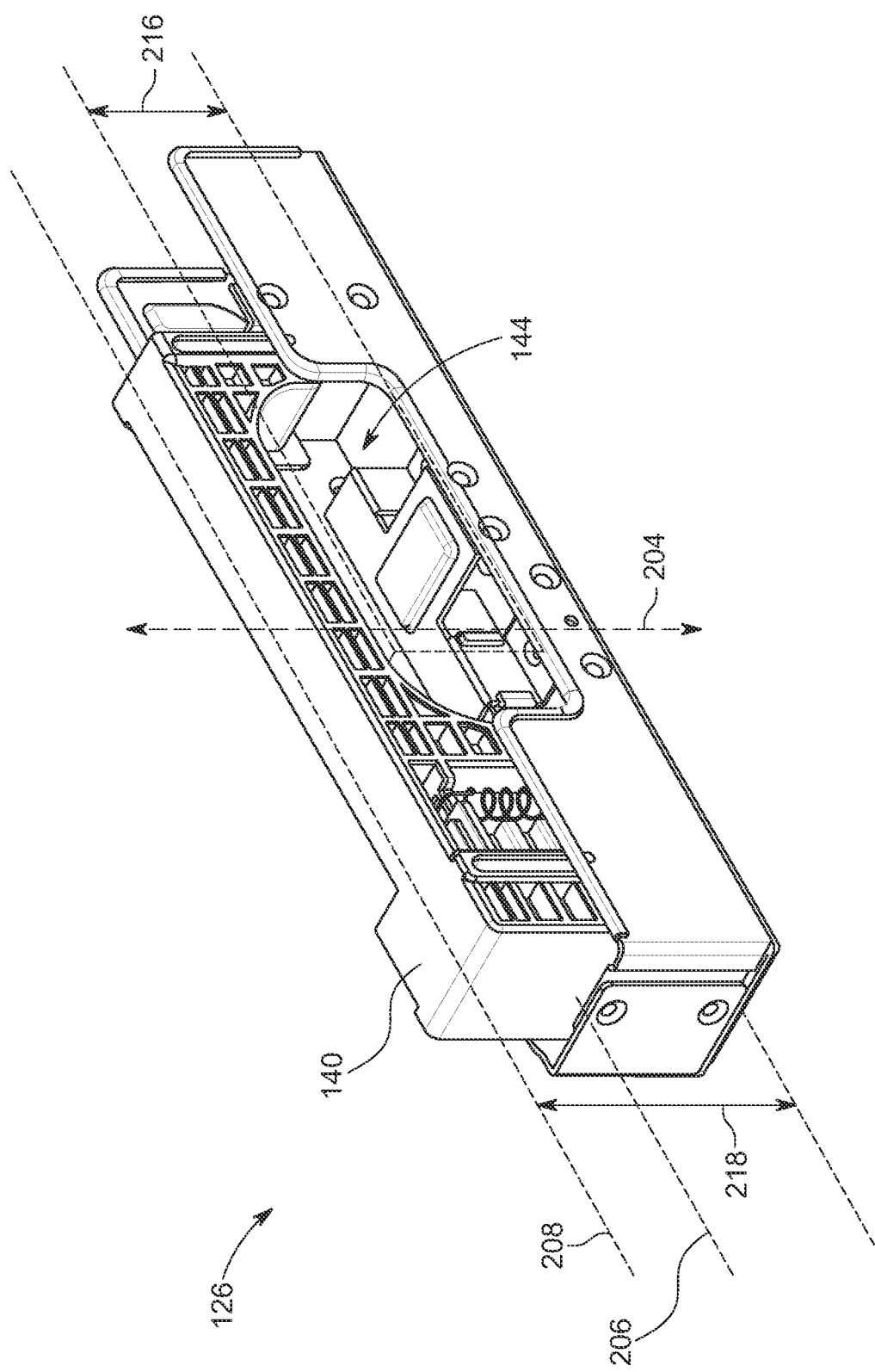
FIG. 2C is a perspective view of the retractable handle assembly of FIG. 2A when the handle is in the open position.

FIG. 2C shows the retractable handle assembly 126 with the handle 140 deployed. When deployed, the handle 140 moves along a predetermined path along the second axis 204 from the closed position 206 to the open position 208, exposing a handle loop 144. The retractable handle assembly 126 has an open height 218 and a handle loop height 216 when the handle is in the open position 208. According to some embodiments, the open height 218 is between about 18 millimeters to about 35 millimeters. According to some embodiments, the handle loop height 216 is between about 8 millimeters and about 25 millimeters. It would be apparent to a person of ordinary skill in the art that the heights of the retractable handle assembly 126 could be adjusted to provide a user with enough operating space to manipulate the handle 140.

Figure 2D:
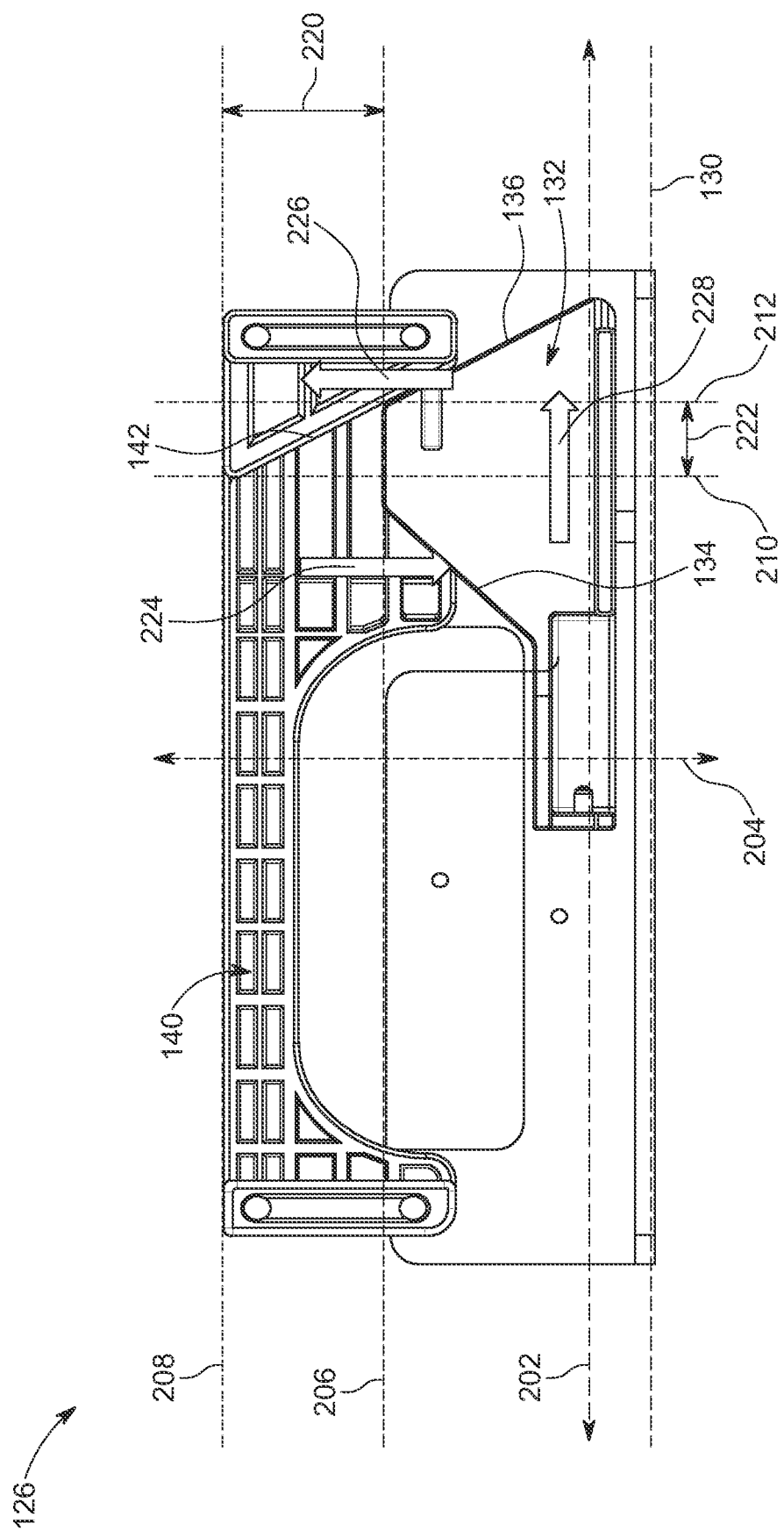
FIG. 2D is a left side view of the retractable handle assembly of FIG. 2A when the handle is in the open position.

FIG. 2D is a left side view of the deployed retractable handle assembly 126 shown in FIG. 2C. To deploy the handle 140, the first force 224 is exerted against the ramp surface 134 of the sliding member 132. In response to the first force 224, the sliding member 132 moves along the first axis 202, causing the wedge surface 136 to move towards the mating wedge surface 142 of the handle 140. Movement of the wedge surface 136 towards the mating wedge surface 142 causes a second force 226 to deploy the handle 140 by moving the handle 140 from the closed position 206 to the open position 208. According to some embodiments, movement of the sliding member 132 along the first axis 202 causes the wedge surface 136 to exert a third force 228 on the mating wedge surface 142. The third force 228 causes the second force 226. According to some embodiments, the third force 228 is about 10.1 newtons. According to some embodiments, the base plane 130 is configured such that it corresponds to a horizontal plane. In such a configuration, the first force 224 is directed in a downward direction; the second force 226 is directed in an upward direction; and the third force 228 is directed in a horizontal direction.

It should be noted that the objective of exerting the first force 224 is to cause the wedge surface 136 of the sliding member 132 to push against the mating wedge surface 142 of the handle 140. According to some embodiments, the first force 224 is angled perpendicularly relative to and directed towards the base plane 130. However, a weight force (e.g., the weight of a weight-bearing member released onto the ramp surface 134) which causes the first force 224 does not need to be perpendicular relative to the base plane 130. For example, the weight force may be pivoted towards the mating wedge surface 142. As such, the first force 224 would be a component of the weight force that is perpendicular relative to the base plane 130.

According to some embodiments, each of the ramp surface 134 and the wedge surface 136 of the sliding member 132 has an angle relative to the base plane 130 of about 45 degrees to about 60 degrees. According to some other embodiments, the design angles for the ramp surface 134 and the wedge surface 136 can be calculated as a function of the cotangent of a vertical distance 220 divided by a horizontal distance 222. The vertical distance 220 is the distance traveled by the handle 140 between the closed position 206 and the open position 208. The horizontal distance 222 is the distance traveled by the sliding member 132 between the initial position 210 and the engaged position 212. According to some embodiments, the angle of the mating wedge surface 142 relative to the base plane 130 complements the angle of the wedge surface 136 so that the interface between the wedge surface 136 and the mating wedge surface 142 is maximized.

Figure 3:
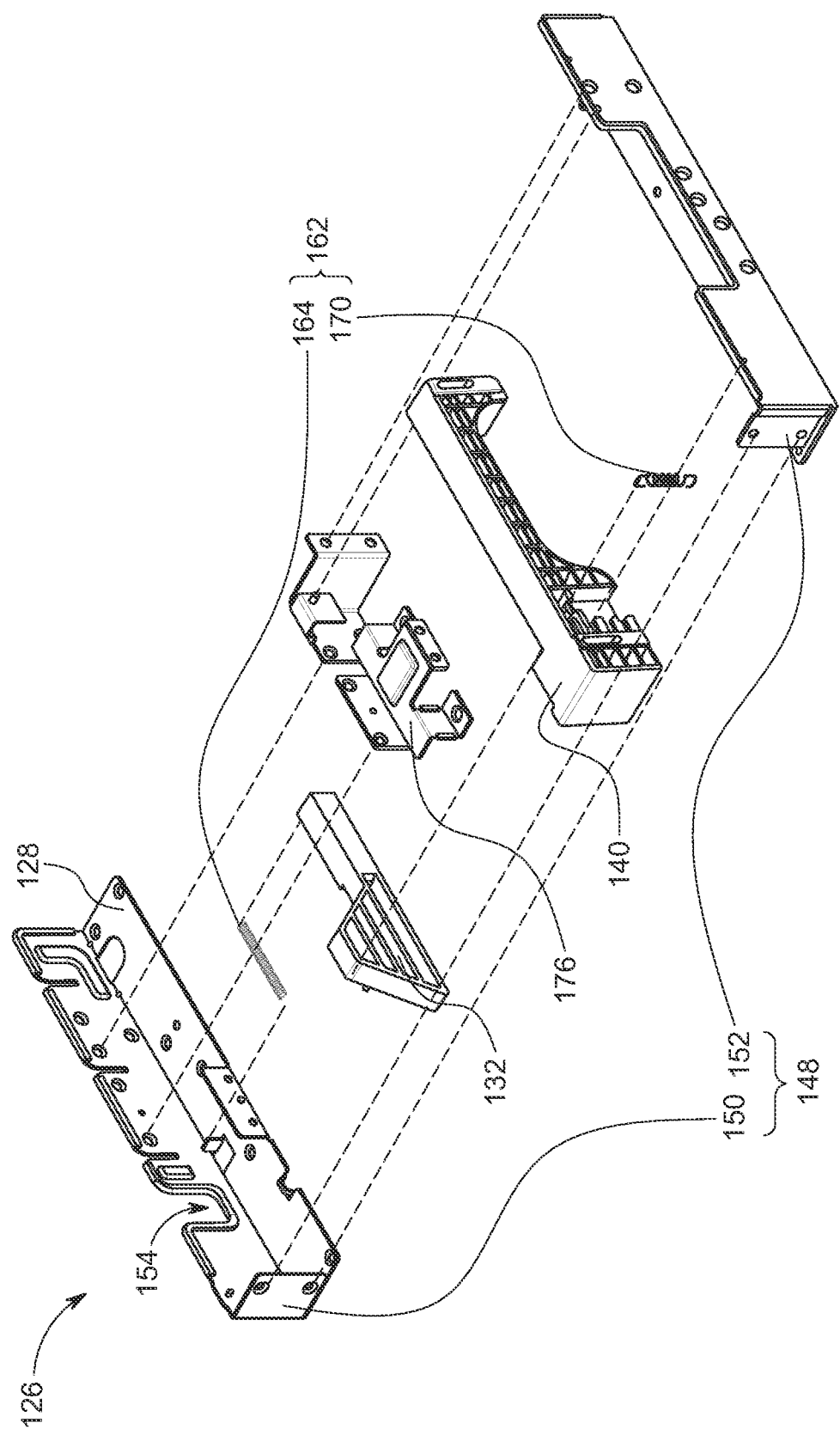
FIG. 3 is an exploded view of the retractable handle assembly of FIG. 2A, according to some embodiments.

Referring to FIG. 3, an exploded view of the retractable handle assembly 126 from FIG. 2A is shown. According to some embodiments, the retractable handle assembly 126 includes a base plate 128, a sliding member 132 and a handle 140. The retractable handle assembly 126 may include other components, such as a sliding member bracket 176, a cover 148, and a reset mechanism 162. According to some embodiments, the sliding member bracket 176 restricts the sliding member 132 to move on a predetermined path along the first axis 202. According to some embodiments, the cover 148 may be integrated with the base plate 128. Furthermore, the cover 148 may be assembled from one or more cover pieces that enclose the handle 140 partly or completely when the handle 140 is closed. For example, as shown, the cover 148 may include a first cover piece 150 and a second cover piece 152. The reset mechanism 162 resets the handle 140 and the sliding member 132 to their initial positions (i.e., the closed position 206 and the initial position 210, respectively) when external forces are removed. According to some embodiments, the reset mechanism 162 may include a first reset spring 164 for resetting the sliding member 132 and/or a second reset spring 170 for resetting the handle 140. The features of these other components are discussed in detail below.

Figure 4A:
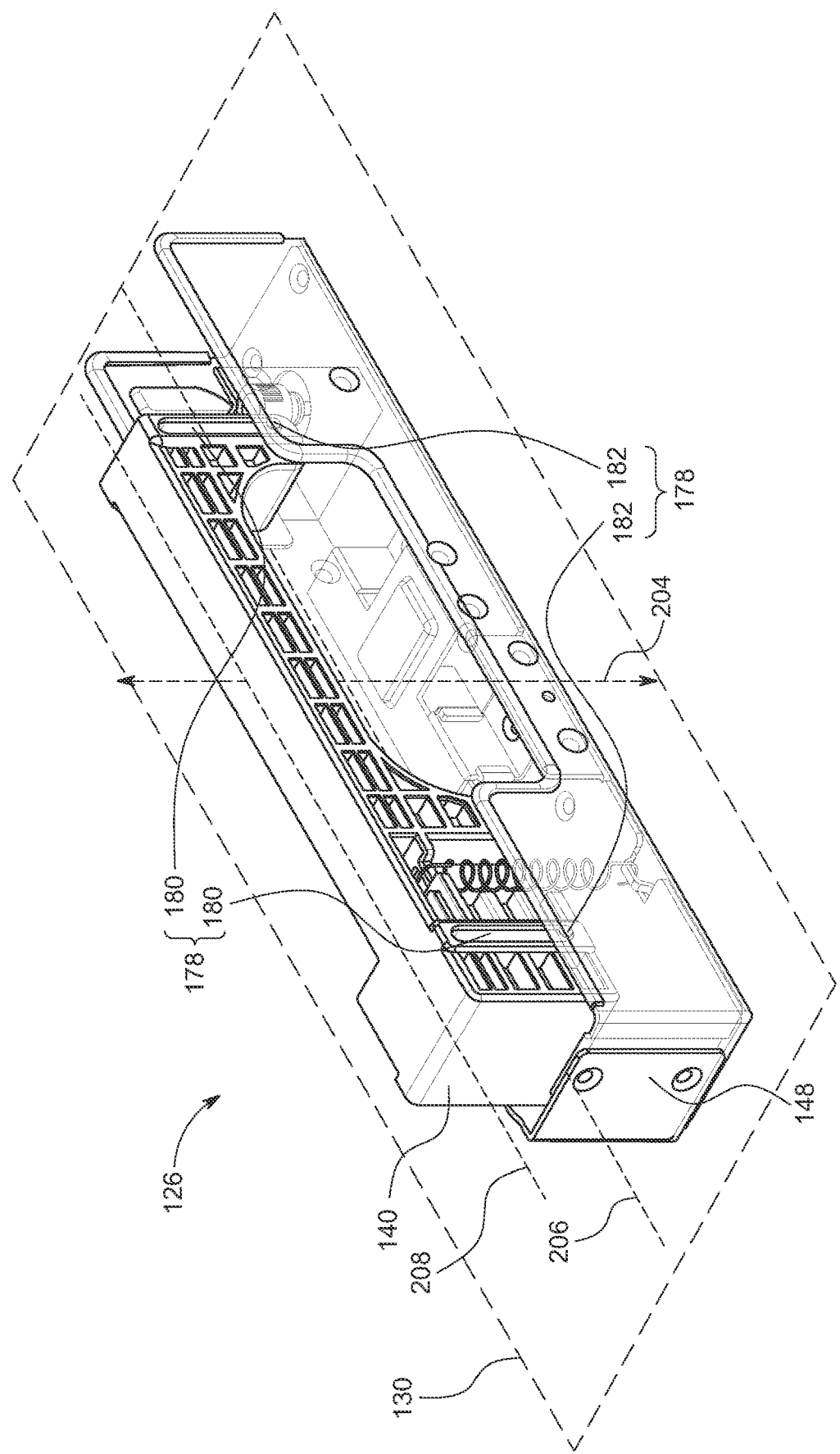
FIG. 4A is a perspective view of the retractable handle assembly from the right side, illustrating a handle guide feature, according to some embodiments.

FIGS. 4A through 4F show in detail certain other components of the retractable handle assembly 126. FIG. 4A is a perspective view of the retractable handle assembly 126 from the right side, illustrating a handle guide feature 178, according to some embodiments. The handle guide feature 178 is configured to restrict the handle 140 to move on a predetermined path along the second axis 204 (e.g., a vertical axis). According to some embodiments, the handle guide feature 178 includes a first guide member and a second guide member. The first guide member is attached to the handle 140 and engages with a second guide member. According to some embodiments, the first guide member has a guide track 180 that is attached to the handle 140. The guide track 180 runs parallel to the second axis 204 (e.g., a vertical axis). The second guide member has a guide pin 182. According to some embodiments, the guide pin 182 is attached to an inner surface of the cover 148 and protrudes towards the guide track 180. The guide track 180 retains the guide pin 182 therein. The guide track 180 slides relative to the guide pin 182 and enables the handle 140 to move between the closed position 206 and the open position 208. According to some embodiments, the retractable handle assembly 126 may include multiple sets of handle guide features 178. For instance, the exemplary retractable handle assembly 126 shown in FIG. 4A has guide tracks 180 and guide pins 182 fitted to both ends of the handle 140 to facilitate even and smooth movement of the handle 140.

Figure 4B:
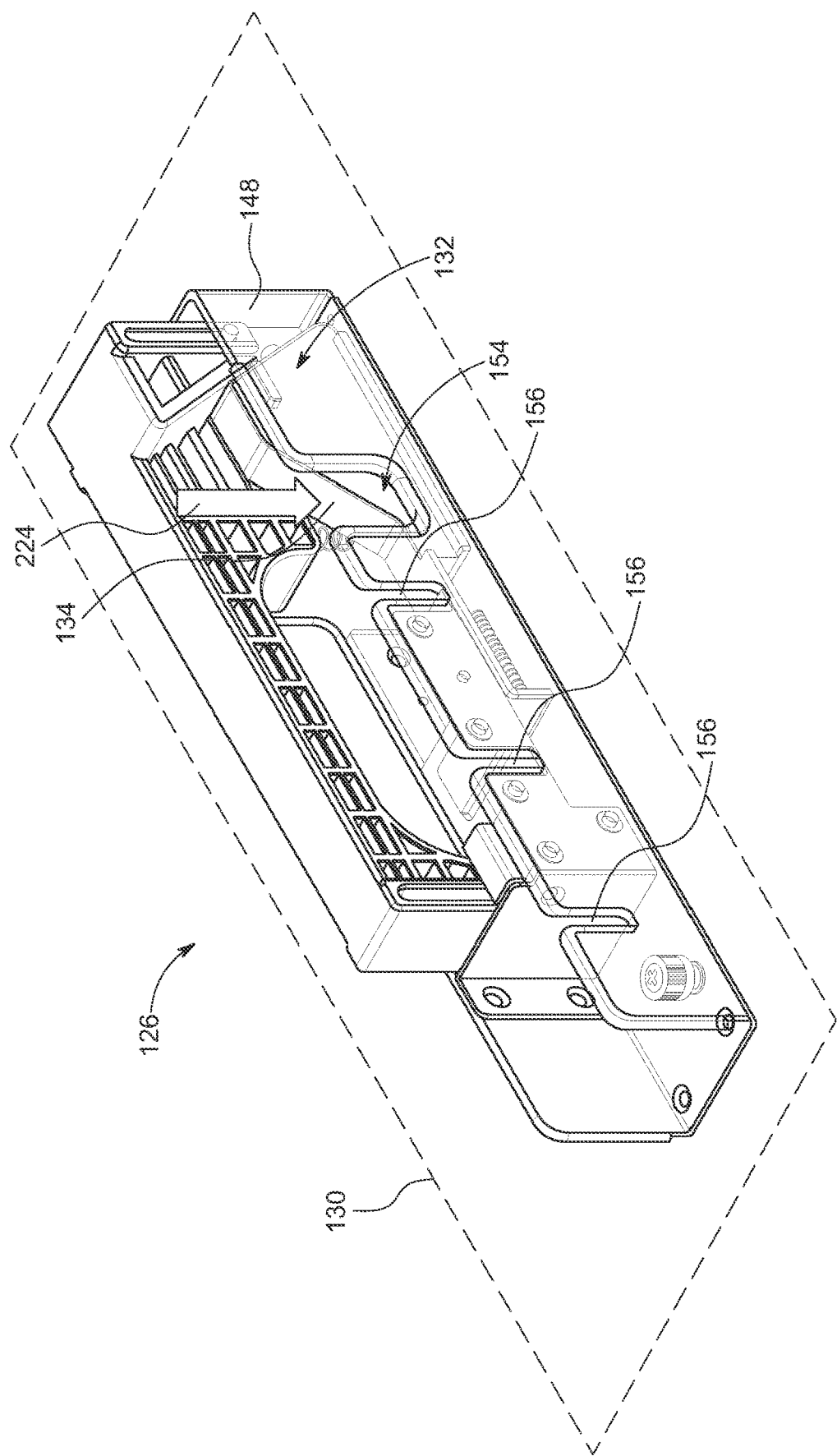
FIG. 4B is a perspective view of the retractable handle assembly from the left side, illustrating a recess feature, according to some embodiments.

FIG. 4B is a perspective view of the retractable handle assembly 126 from the left side, illustrating a recess feature, according to some embodiments. The recess feature is adapted to receive one or more weight-bearing members (not shown) on an electronic device and guide at least one of the weight-bearing members (not shown) onto the ramp surface 134. The coupling operation between the weight-bearing members and the retractable handle assembly 126 will be shown in FIGS. 4C and 4D. As shown in FIG. 4B, a first recess 154 is positioned in the cover 148 and extends towards the base plane 130. The first recess 154 is aligned with the ramp surface 134 of the sliding member 132. According to some embodiments, the retractable handle assembly 126 may include additional secondary recesses 156 to accommodate one or more additional weight-bearing members to help distribute the weight of the electronic device along the length of the cover 148.

Figure 4C:
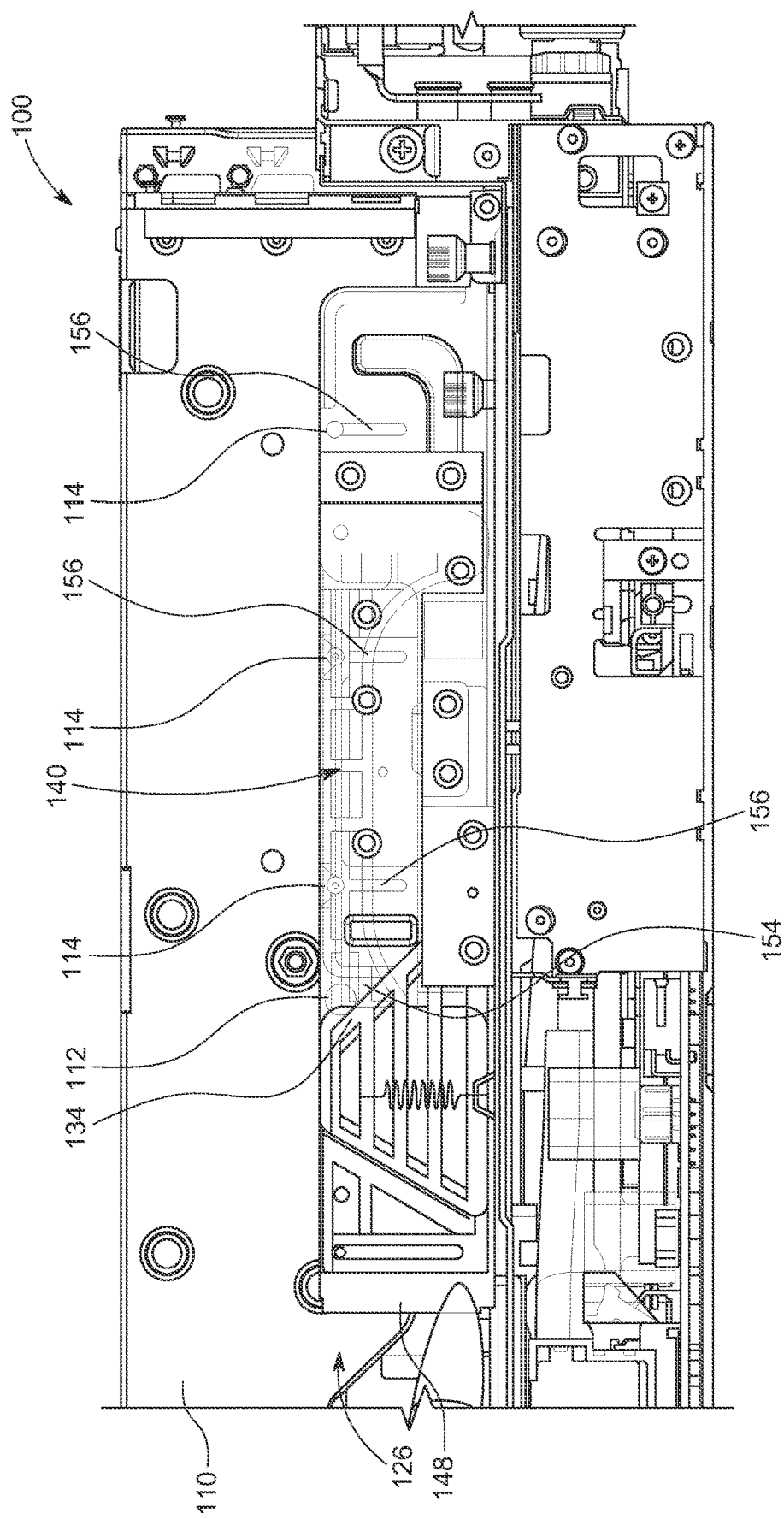
FIG. 4C is a sectional view of a chassis system of FIG. 1 with the retractable handle assembly in the closed position, according to some embodiments.
Figure 4D:
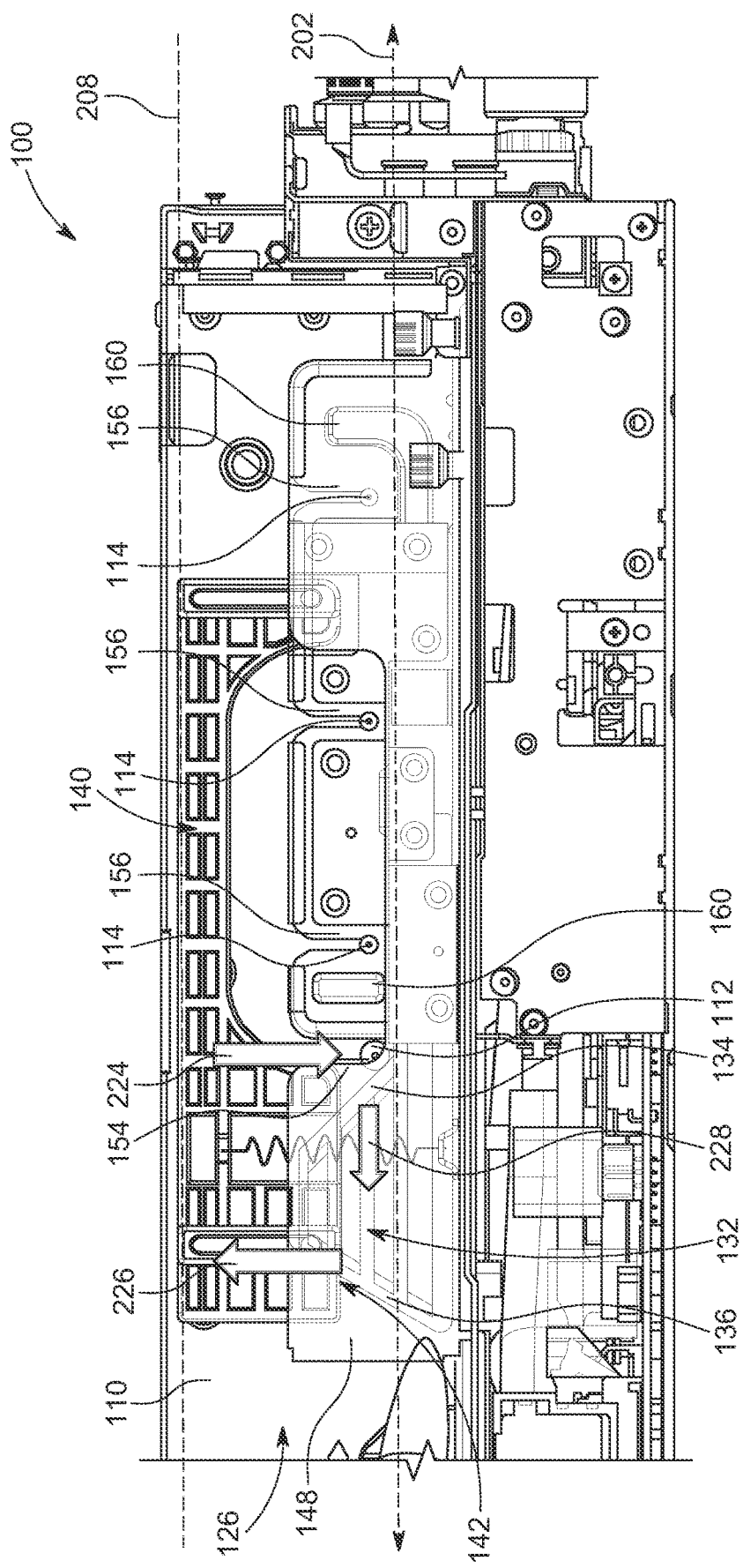
FIG. 4D is a sectional view of a chassis system of FIG. 1 with the retractable handle assembly in the open position, according to some embodiments.

FIGS. 4C and 4D are sectional views of a chassis system 100, showing the weight-bearing members (e.g., 112 and 114) of an electronic device 110 being coupled to the recesses (e.g., 154 and 156) in the cover 148 of a retractable handle assembly 126. Referring to FIG. 4C, a first weight-bearing member has a shaft pin 112 attached to a surface of the electronic device 110. To prepare the deployment of the retractable handle assembly 126, the shaft pin 112 is positioned above the first recess 154 so that the shaft pin 112 is aligned with the ramp surface 134. According to some embodiments the electronic device 110 has additional weight bearing members, such as the secondary shaft pins 114, for guiding the shaft pin 112 and help distribute the weight of the electronic device 110 along the length of the cover 148. Each secondary shaft pin 114 is aligned with a corresponding secondary recess 156.

Referring to FIG. 4D, the retractable handle assembly 126 is deployed by releasing the shaft pin 112 into the first recess 154 and the secondary shaft pins 114 into the corresponding secondary recesses 156. The recesses 154 and 156 guide the shaft pin 112 onto the ramp surface 134. The weight of the electronic device 110 provides a first force 224 directed against the ramp surface 134. As described above, the sliding member 132 moves along the first axis 202 in response to the first force 224, causing the wedge surface 136 to move towards the mating wedge surface 142 of the handle 140. Movement of the wedge surface 136 towards mating wedge surface 142 causes a second force 226 to deploy the handle 140 by moving the handle 140 to the open position 208. According to some embodiments, movement of the sliding member 132 along the first axis 202 causes the wedge surface 136 to exert a third force 228 on the mating wedge surface 142. The third force 228 causes the second force 226. According to some embodiments, the retractable handle assembly 126 may include reinforcing features to ensure that the cover 148 does not deform under the weight of the electronic device 110. For example, as shown in FIG. 4D, the surface of the cover 148 has strengthening ribs 160 to add structural rigidity.

Figure 4E:
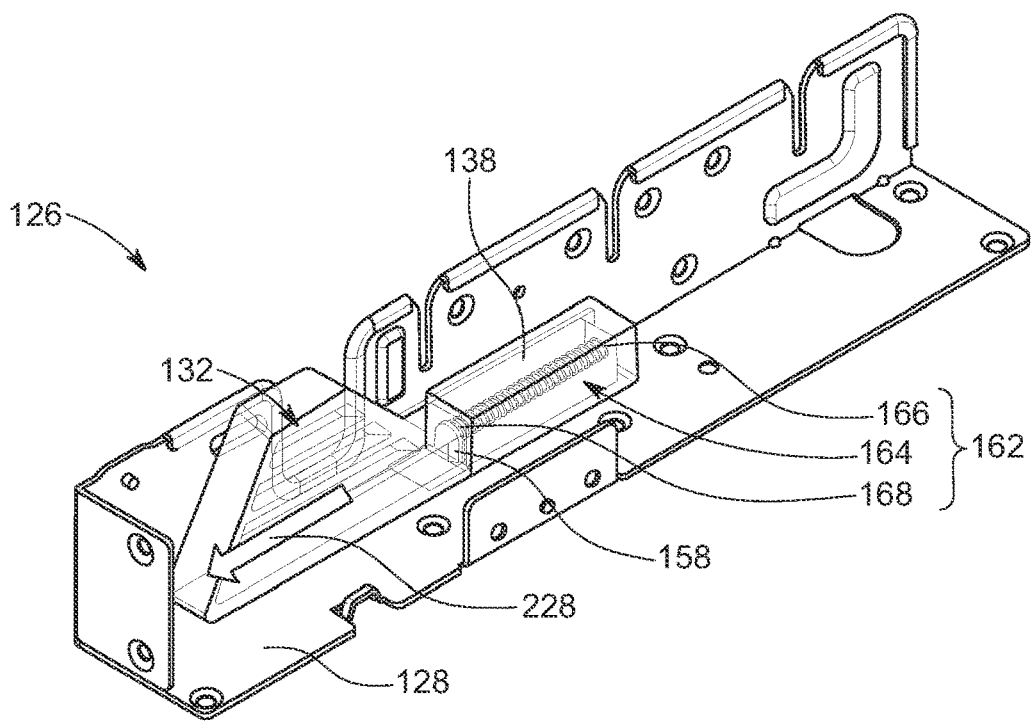
FIG. 4E is a perspective view of the retractable handle assembly from the left side, illustrating a first reset spring, according to some embodiments.
Figure 4F:
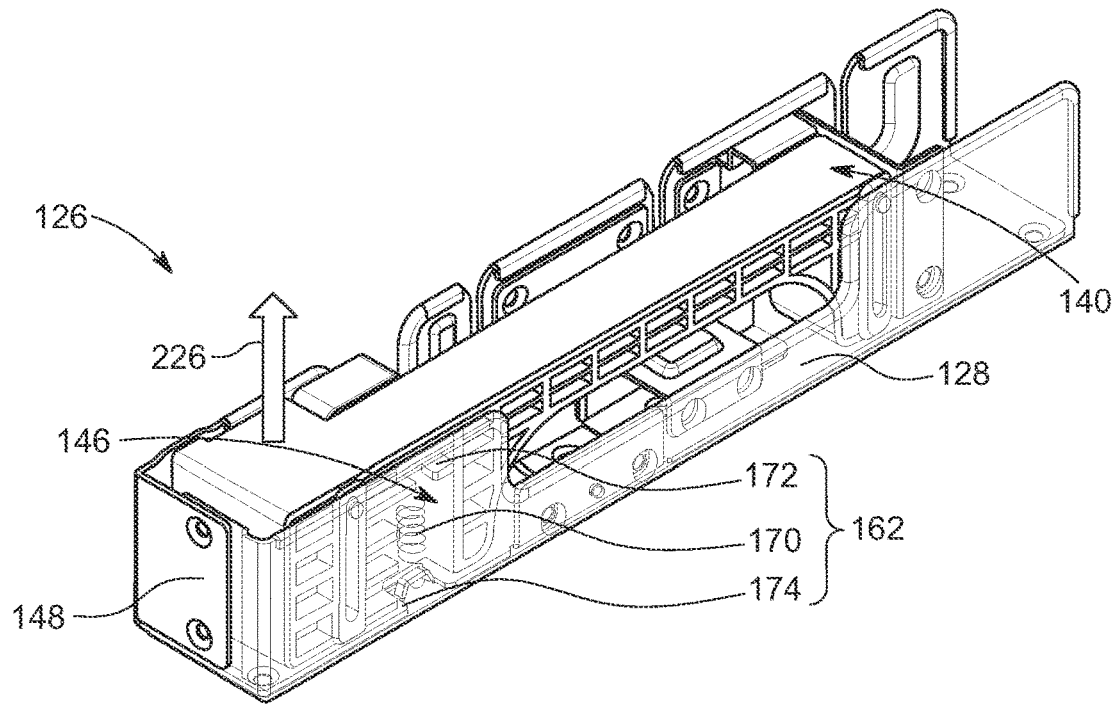
FIG. 4F is a perspective view of the retractable handle assembly from the right side, illustrating a second reset spring, according to some embodiments.

FIGS. 4E and 4F show a reset mechanism 162 for resetting the handle 140 to the closed position 206 once the external forces are removed, according to some embodiments. Referring to FIG. 4E, the reset mechanism 162 may include a first reset spring 164. A first end 166 and a second end 168 of the first reset spring 164 are coupled to the sliding member 132 and the base plate 128, respectively. The first reset spring 164 provides a spring force opposite the third force 228. According to some embodiments, the sliding member 132 further includes a spring sheath 138. The first reset spring 164 is positioned inside the spring sheath 138. The first end 166 of the first reset spring 164 is coupled to an inner surface of the spring sheath 138. According to some embodiments, the base plate 128 has a bent edge 158 that projects into the retractable handle assembly 126. The second end 168 of the first reset spring 164 is coupled to the bent edge 158.

FIG. 4F shows that the reset mechanism 162 may further include a second reset spring 170. A first end 172 and a second end 174 of the second reset spring 170 are coupled to the handle 140 and a base plate 128, respectively. The second reset spring 170 provides a spring force opposite the second force 226. According to some embodiments, the second reset spring 170 is positioned in a cavity region 146 of the handle 140.

Figure 5A:
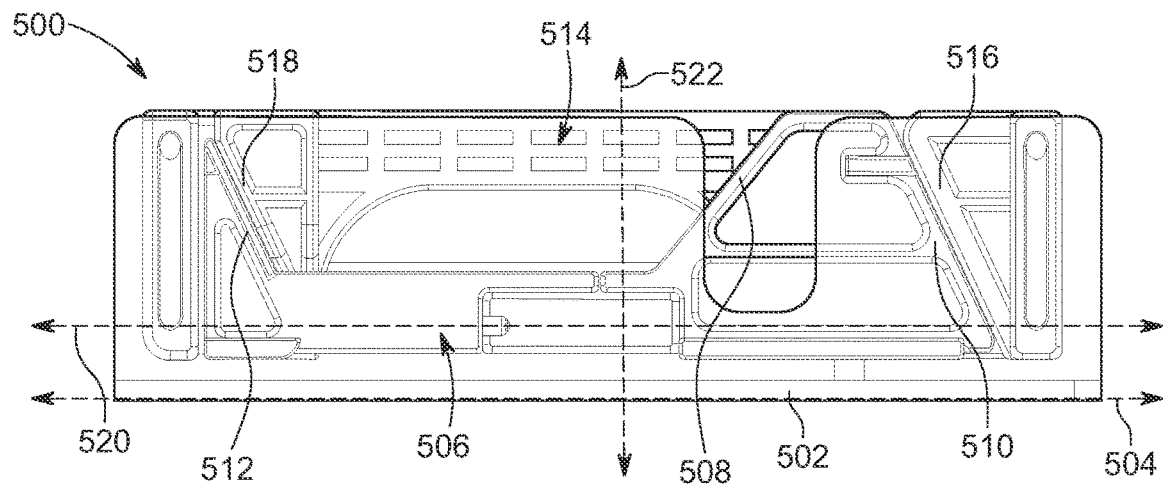
FIG. 5A is a left side view of a retractable handle assembly with a sliding member having two wedge surfaces, according to some embodiments.
Figure 5B:
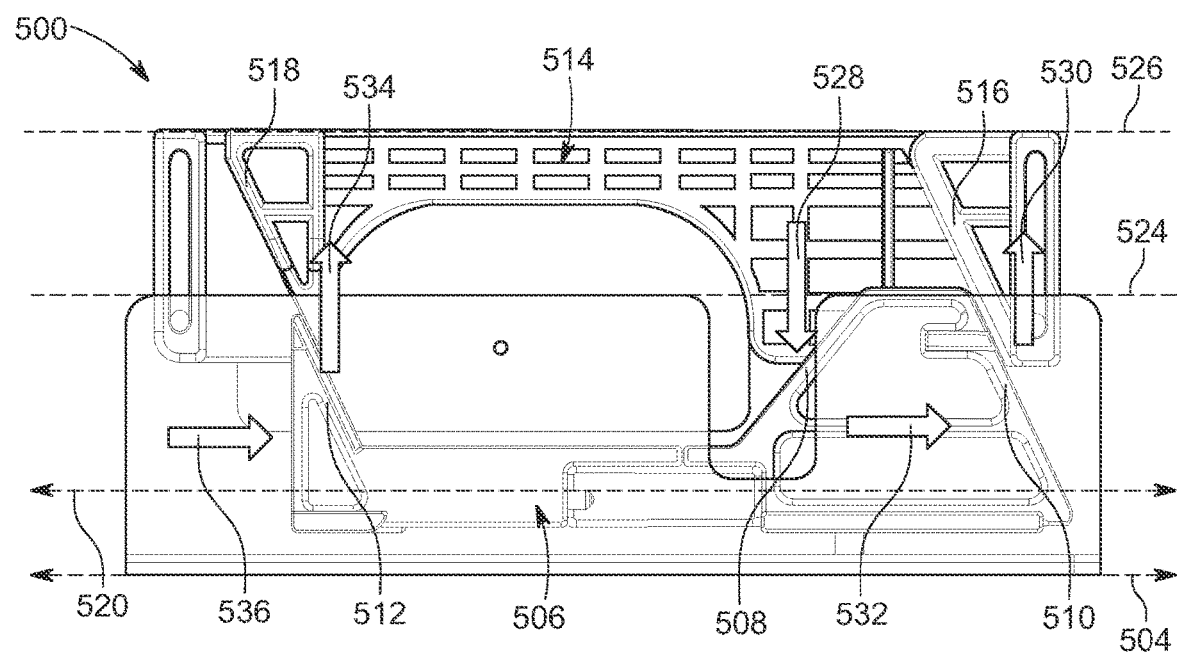
FIG. 5B is a left side view of the retractable handle assembly of FIG. 5A with the handle in the open position.
Figure 5C:
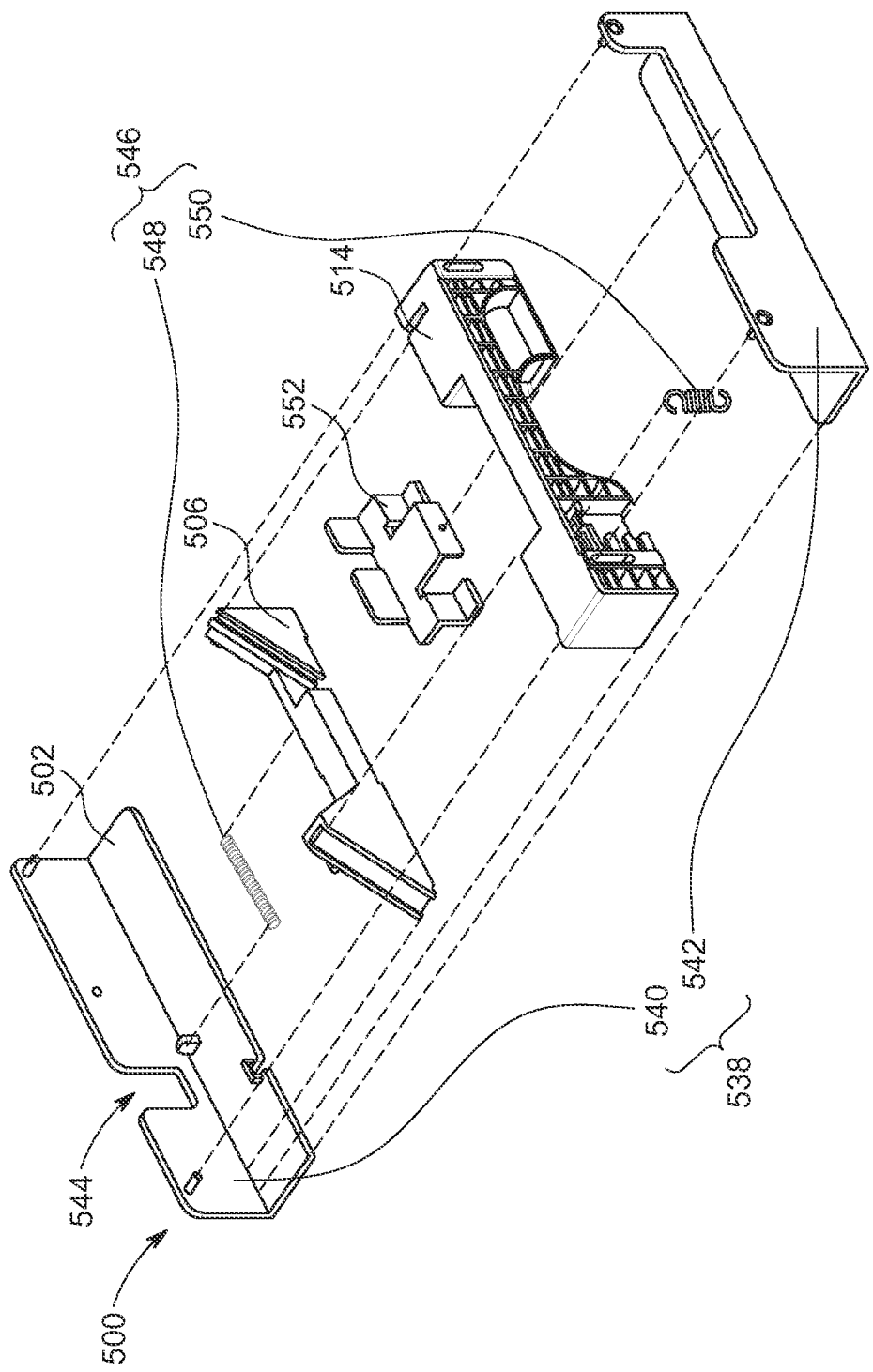
FIG. 5C is an exploded view of the retractable handle assembly of FIG. 5A.

FIGS. 5A through 5C generally refer to an embodiment of a retractable handle assembly 500 that has a sliding member 506 with two wedge surfaces (i.e., 510 and 512) and a handle 514 with two mating wedge surfaces (i.e., 516 and 518). FIG. 5A shows the internal aspects of the retractable handle assembly 500. The retractable handle assembly 500 includes a base plate 502, a sliding member 506 and a handle 514. The base plate 502 defines a base plane 504. The sliding member 506 is movable along a first axis 520 that is parallel to the base plane 504. The handle 514 is movable along a second axis 522 that is perpendicular to the base plane 504. The sliding member 506 has a ramp surface 508, a first wedge surface 510, and a second wedge surface 512. The handle 514 has a first mating wedge surface 516 and a second mating wedge surface 518. The first mating wedge surface 516 is positioned opposite the first wedge surface 510. The second mating wedge surface 518 is positioned opposite the second wedge surface 512. Each of the ramp surface 508, the first wedge surface 510, and the second wedge surface 512 is angularly oriented relative to the base plane 504.

Referring to FIG. 5B, the operation of the retractable handle assembly 500 is shown. To deploy the handle 514, the ramp surface 508 of the sliding member 506 receives a first force 528. In response to the first force 528, the sliding member 506 moves along the first axis 520, causing the wedge surfaces 510 and 512 to move towards the mating wedge surfaces 516 and 518, respectively. Movement of the first wedge surface 510 and the second wedge surface 512 respectively cause a second force 530 and a fourth force 534 to deploy the handle 514 by moving the handle 514 from a closed position 524 to an open position 526. According to some embodiments, movement of the sliding member 506 towards the first mating wedge surface 516 causes the first wedge surface 510 to exert a third force 532 on the first mating wedge surface 516. The movement of the sliding member 506 also causes the second wedge surface 512 to exert a fifth force 536 on the second mating wedge surface 518. The third force 532 causes the second force 530. The fifth force 536 causes the fourth force 534. According to some embodiments, the mating wedge surfaces 516 and 518 are arranged on the distal ends of the handle 514 so that the forces 530 and 534 are exerted against the handle 514 more evenly. According to some embodiments, the base plane 504 is configured such that it corresponds to a horizontal plane. In such a configuration, the first force 528 is directed in a downward direction; the second force 530 and the fourth force 534 are directed in upward directions; the third force 532 and the fifth force 536 are directed a horizontal direction.

Referring to FIG. 5C, an exploded view of the retractable handle assembly 500 illustrates its components, according to some embodiments. As shown, the retractable handle assembly 500 includes a base plate 502, a sliding member 506, and a handle 514. The retractable handle assembly 500 may further include a sliding member bracket 552, a cover 538, and a reset mechanism 546. According to some embodiments, the sliding member bracket 552 restricts the sliding member 506 to move on a predetermined path along the first axis 520. According to some embodiments, the cover 538 may be integrated with the base plate 502. Furthermore, the cover 538 may be assembled from one or more cover pieces that enclose the handle 514 partly or completely when the handle 514 is closed. As shown, for example, the cover 538 may include a first cover piece 540 and a second cover piece 542. According to some embodiments, one of the cover pieces (i.e., 540 or 542) includes a recess 544 adapted to receive a weight-bearing member (not shown). The reset mechanism 546 is configured to reset the handle 514 and the sliding member 506 to their initial positions when the external forces are removed. According to some embodiments, the reset mechanism 546 may include a first reset spring 548 for resetting the sliding member 506. The reset mechanism 546 may further include a second reset spring 550 for resetting the handle 514. According to some embodiments, the first reset spring 548 is couple to the base plate 502 on one end and the sliding member 506 on the other. The first reset spring 548 provides a spring force opposite the third force 532 and the fifth force 536. According to some embodiments, the second reset spring 550 is couple to the base plate 502 on one end and the handle 514 on the other. The second reset spring 550 provides a spring force opposite the second force 530 and the fourth force 534.

Figure 6C:
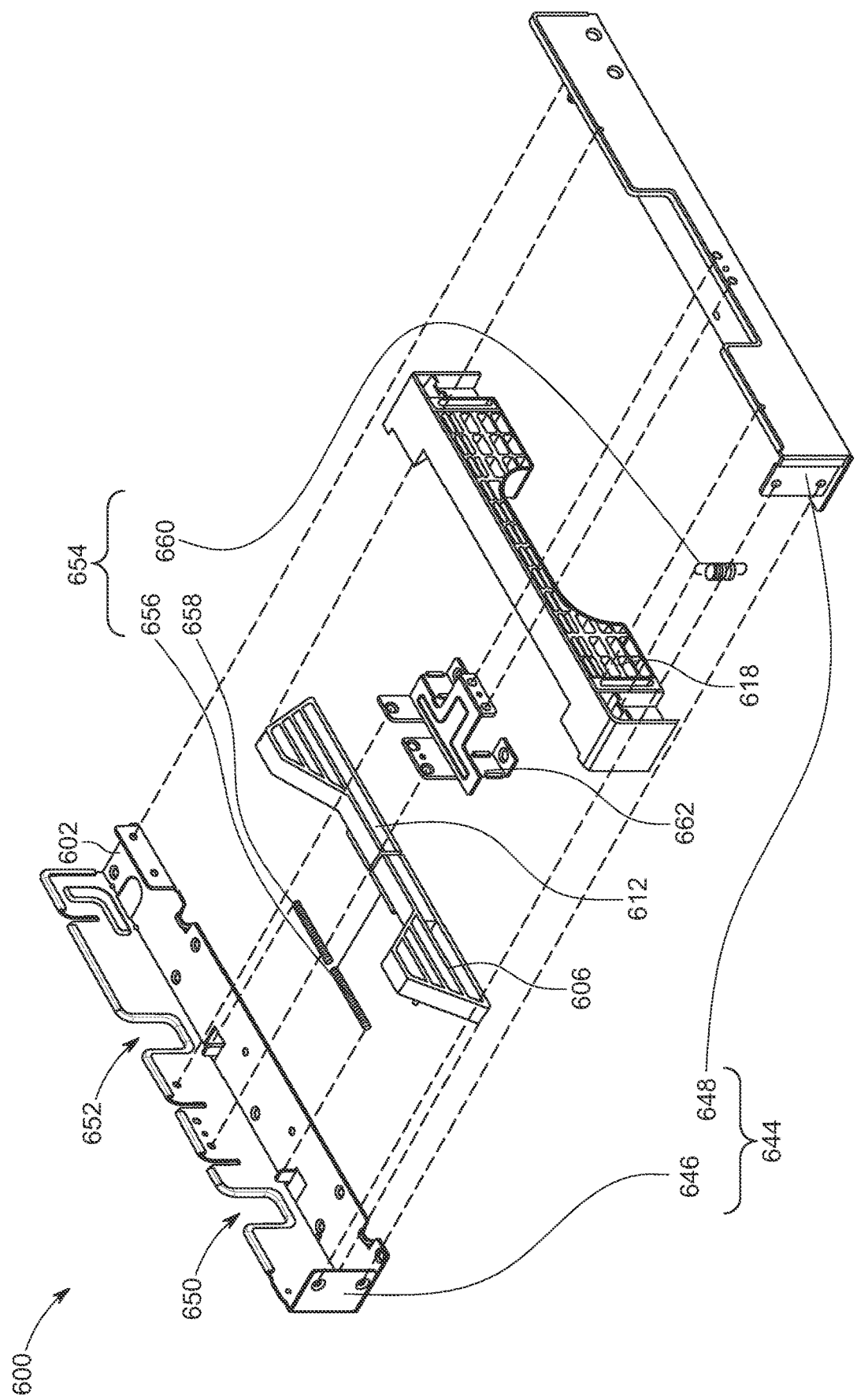
FIG. 6C is an exploded view of the retractable handle assembly of FIG. 6A.

FIGS. 6A through 6C generally refer to an embodiment of a retractable handle assembly 600 that has two sliding members (i.e., 606 and 612) and a handle 618 with two mating wedge surfaces (i.e., 620 and 622). FIG. 6A shows the internal aspects of the retractable handle assembly 600. The retractable handle assembly 600 includes a base plate 602, a first sliding member 606, a second sliding member 612, and a handle 618. The base plate 602 defines a base plane 604. The sliding members 606 and 612 are movable along a first axis 624 that is parallel to the base plane 604. The handle 618 is movable along a second axis 626 that is perpendicular to the base plane 604. The first sliding member 606 has a first ramp surface 608 and a first wedge surface 610. The second sliding member 612 has a second ramp surface 614 and a second wedge surface 616. The handle 618 has a first mating wedge surface 620 and a second mating wedge surface 622. The first mating wedge surface 620 is positioned opposite the first wedge surface 610 of the first sliding member 606. The second mating wedge surface 622 is positioned opposite the second wedge surface 616 of the second sliding member 612. Each of the ramp surfaces (i.e., 608 and 614) and the wedge surfaces (i.e., 610 and 616) are angularly oriented relative to the base plane 604.

Referring to FIG. 6B, the operation of the retractable handle assembly 600 is shown. To deploy the handle 618, the first ramp surface 608 receives a first force 632 and the second ramp surface 614 receives a fourth force 638. In response to the first force 632, the first sliding member 606 moves along the first axis 624, causing the first wedge surface 610 to move towards the first mating wedge surface 620. In response to the fourth force 638, the second sliding member 612 moves along the first axis 624, causing the second wedge surface 616 to move towards the second mating wedge surface 622. Movement of the first wedge surface 610 and the second wedge surface 616 cause a second force 634 and a fifth force 640 to deploy the handle 618 by moving the handle 618 from a closed position 628 to an open position 630. According to some embodiments, movement of the first sliding member 606 towards the first mating wedge surface 620 causes the first wedge surface 610 to exert a third force 636 on the first mating wedge surface 620. Movement of the second sliding member 612 towards the second mating wedge surface 622 causes the second wedge surface 616 to exert a sixth force 642 on the second mating wedge surface 622. The third force 636 causes the second force 634. The sixth force 642 causes the fifth force 640. According to some embodiments, the mating wedge surfaces 620 and 622 are arranged on the distal ends of the handle 618 in order to exert the forces 634 and 640 on the handle 618 more evenly. According to some embodiments, the base plane 604 is configured such that it corresponds to a horizontal plane. In such a case, the first force 632 and the fourth force 638 are directed in downward directions; the second force 634 and the fifth force 640 are directed in upward directions; and the third force 636 and the sixth force 642 are directed in horizontal directions.

Referring to FIG. 6C, an exploded view of the retractable handle assembly 600 illustrates its components, according to some embodiments. As shown, the retractable handle assembly 600 includes a base plate 602, a first sliding member 606, a second sliding member 612, and a handle 618. The retractable handle assembly 600 may further include a sliding member bracket 662, a cover 644, and a reset mechanism 654. According to some embodiments, the sliding member bracket 662 restricts the sliding members 606 and 612 to move along the first axis 624. According to some embodiments, the cover 644 may be integrated with the base plate 602. Furthermore, the cover 644 may be assembled from one or more cover pieces that enclose the handle 618 partly or completely when the handle 618 is closed. As shown, for example, the cover 644 may include a first cover piece 646 and a second cover piece 648. According to some of the embodiments, one of the cover pieces (e.g., 646 or 648) may include a first recess 650 for receiving a first weight-bearing member (not shown). The same cover piece or different one (e.g., 646 or 648) may include a second recess 652 for receiving a second weight-bearing member (not shown). According to some embodiments, the reset mechanism 654 may include one or more reset springs (e.g., 656, 658, and 660) that resets the handle 618 and the sliding members 606 and 612 to their initial positions when the external forces are removed. According to some embodiments, a first reset spring 656 is couple to a base plate 602 on one end and the first sliding member 606 on the other. The first reset spring 656 provides a spring force opposite the third force 636. According to some embodiments, the second reset spring 658 is couple to the base plate 602 on one end and the second sliding member 612 on the other. The second reset spring 658 provides a spring force opposite the sixth force 642. According to some embodiments, the third reset spring 660 is couple to the base plate 602 on one end and the handle 618 on the other. The third reset spring 660 provides a spring force opposite the second force 634 and the fifth force 640.

Figure 7A:
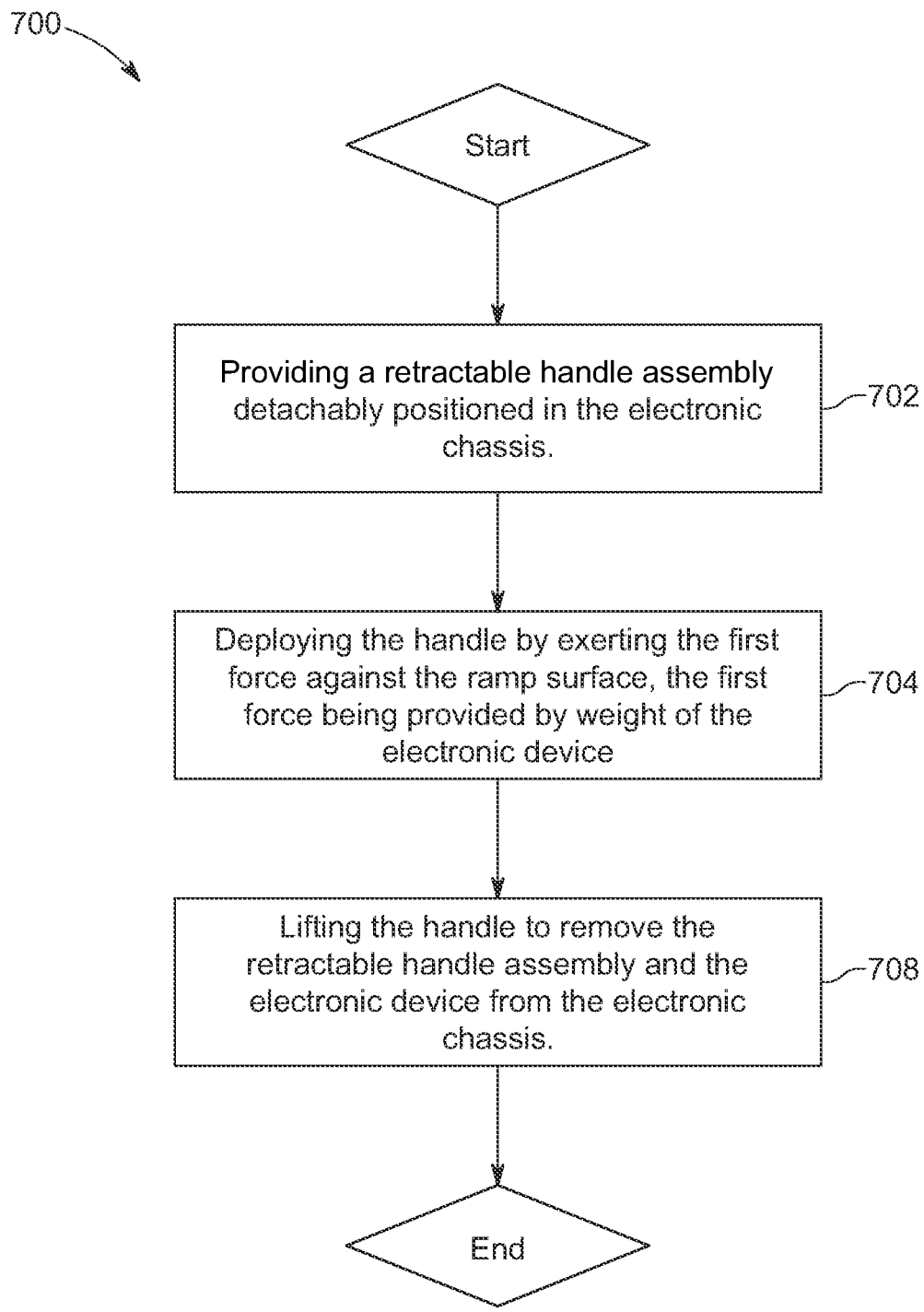
FIG. 7A is a flowchart illustrating example operations for disassembling an electronic device from an electronic chassis using a retractable handle assembly, according to some embodiments.
Figure 7B:
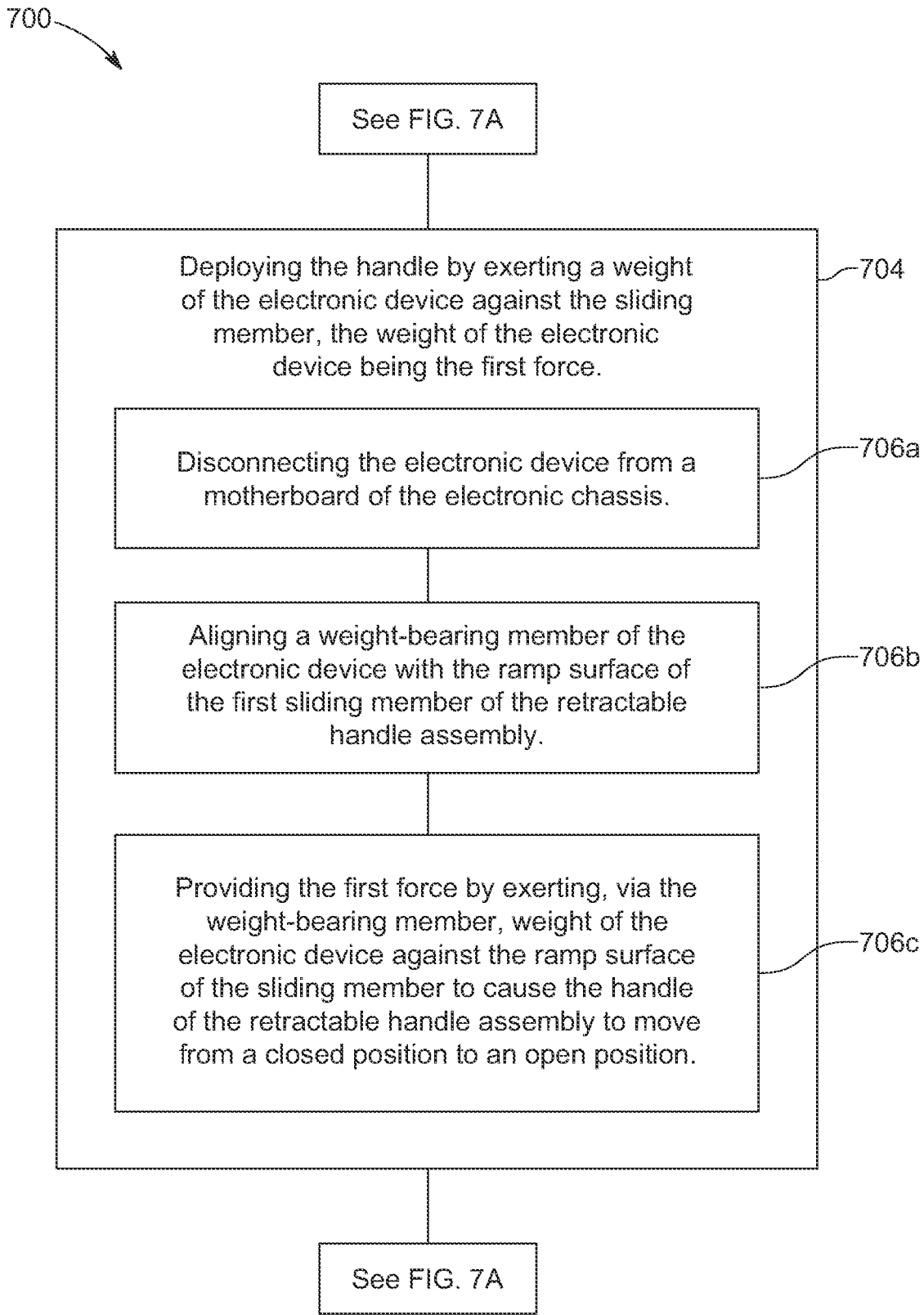
FIG. 7B is a continuation of flowchart 7A.

With reference to FIGS. 7A and 7B, an exemplary method 700 for disassembling an electronic device from an electronic chassis using a retractable handle assembly, in accordance with certain aspects of the present disclosure, is shown. It should be understood that the exemplary method 700 is presented solely for illustrative purposes, and that in other methods in accordance with the present disclosure can include additional, fewer, or alternative steps performed in similar or alternative orders, or in parallel.

Referring to FIG. 7A, at step 702, the method begins with providing a retractable handle assembly detachably positioned in the electronic chassis. Exemplary embodiments of the retractable handle assembly have been described in the preceding paragraphs with reference to FIGS. 1 through 6C. According to some embodiments, the retractable handle assembly may be attached to a lower panel in the electronic chassis, the lower panel being removable from the electronic chassis. In some embodiments, the lower panel may be a mezzanine layer or a functional component of the electronic chassis that acts as a mezzanine layer. For instance, the lower panel could be a water collecting tray that separates a cold plate module from other components in the electronic chassis, as exemplified in FIG. 1. According to some embodiments, the electronic chassis may include more than one retractable handle assembly. For example, briefly referring to FIG. 1, the chassis system 100 has two retractable handle assemblies 126. Each retractable handle assembly 126 is positioned adjacent to an electronic device 110. Referring back to FIG. 7, at step 704, the method includes deploying the handle by exerting the first force against the ramp surface, the first force being provided by the weight of the electronic device. At step 708, the method ends with lifting the handle to remove the retractable handle assembly and the electronic device from the electronic chassis.

Referring to FIG. 7B, step 704 (i.e., deploying the handle) may further include several sub-steps. According to some embodiments, sub-step 706a includes disconnecting the electronic device from a motherboard of the electronic chassis. At sub-step 706b, the method may further include aligning a weight-bearing member of the electronic device with a ramp surface of a sliding member of the retractable handle assembly. Briefly referring to FIG. 4C, the weight-bearing member may include a shaft pin 112 attached to the surface of the electronic device 110, according to some embodiments. Referring back to FIG. 7B, at sub-step 706c, the method may further include providing the first force by exerting, via the weight-bearing member, weight of the electronic device against the ramp surface of the sliding member to cause the handle of the retractable handle assembly to move from a closed position to an open position. As previously discussed in reference to FIG. 4D, when the weight-bearing member (i.e., the shaft pin 112) is released, the weight of the electronic device 110 provides a first force 224 directed against the ramp surface 134. The sliding member moves along a first axis 202 in response to the first force 224, causing the wedge surface 136 to move towards the mating wedge surface 142 of the handle 140. Movement of the wedge surface 136 towards mating wedge surface 142 causes a second force 226 to deploy the handle 140 by moving the handle 140 from a closed position 206 to an open position 208.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A retractable handle assembly for an electronic device, the retractable handle assembly comprising:
   a base plate having a base plane;
   a first sliding member having a first ramp surface and a first wedge surface, the first sliding member being movable along a first axis that is parallel to the base plane, each of the first ramp surface and the first wedge surface being angularly oriented relative to the base plane, the first ramp surface being angled to receive a first force, the first force being angled perpendicularly relative to and towards the base plane, the first sliding member moving along the first axis in response to the first force; and a handle having a first mating wedge surface, the handle being movable along a second axis that is perpendicular to the base plane, the first wedge surface being movable towards the first mating wedge surface in response to the first force, movement of the first wedge surface towards the first mating wedge surface causing a second force that deploys the handle to move from a closed position to an open position.

2. The retractable handle assembly of claim 1, wherein the first sliding member further includes a second wedge surface and the handle further includes a second mating wedge surface, the second wedge surface being movable towards the second mating wedge surface in response to the first force, movement of the second wedge surface towards the second mating wedge surface causes a fourth force that deploys the handle to move from the closed position to the open position.

3. The retractable handle assembly of claim 2:
wherein movement of the first wedge surface towards the first mating wedge surface exerts a third force on the first mating wedge surface along the first axis, the third force causing the second force; and
wherein movement of the second wedge surface towards the second mating wedge surface exerts a fifth force on the second mating wedge surface along the first axis, the fifth force causing the fourth force.

4. The retractable handle assembly of claim 3 further comprising a first reset spring having a first end coupled to the first sliding member and a second end coupled to the base plate, the first reset spring providing a first spring force opposite at least one of the third force and the fifth force.

5. The retractable handle assembly of claim 1 further comprising:
a second sliding member having a second ramp surface and a second wedge surface, the second sliding member being movable along the first axis, each of the second ramp surface and the second wedge surface being angularly oriented relative to the base plane, the second ramp surface being angled to receive a fourth force, the fourth force being angled perpendicularly relative to and towards the base plane, the second sliding member moving along the first axis in response to the fourth force; and
wherein the second wedge surface being movable towards a second mating wedge surface of the handle in response to the fourth force, movement of the second wedge surface towards the second mating wedge surface causing a fifth force that deploys the handle to move from the closed position to the open position.

6. The retractable handle assembly of claim 5, wherein movement of the second wedge surface towards the second mating wedge surface exerts a sixth force on the second mating wedge surface along the first axis, the sixth force causing the fifth force.

7. The retractable handle assembly of claim 1, further comprising a handle guide having a first guide member and a second guide member, the first guide member being attached to the handle and engaging the second guide member to restrict the handle to movement along the second axis.

8. The retractable handle assembly of claim 7, wherein:
the first guide member has a guide track attached to the handle, the guide track extending parallel to the second axis; and
the second guide member has a guide pin protruding towards the guide track, the guide track slidably capturing the guide pin therein.

9. The retractable handle assembly of claim 1 further comprising a cover that extends at least in part parallel to the first axis, the cover having a recess extending towards the base plane, the recess being adapted to receive a weight-bearing member for generating the first force.

10. The retractable handle assembly of claim 9, wherein the recess of the cover is configured to align the weight-bearing member with the ramp surface of the sliding member.

11. The retractable handle assembly of claim 1 further comprising a second reset spring having a first end coupled to the handle and a second end coupled to the base plate, the second reset spring providing a second spring force opposite the second force.

12. The retractable handle assembly of claim 1, wherein the first wedge surface of the first sliding member has an angle relative to the base plane of about 45 degrees to about 60 degrees.

13. The retractable handle assembly of claim 1, wherein the first ramp surface of the first sliding member has an angle relative to the base plane of about 45 degrees to about 60 degrees.

14. The retractable handle assembly of claim 1:
wherein the sliding member is movable between an initial position and an engaged position; and
wherein the first wedge surface has an angle relative to the base plane, the angle being a function of cotangent of a vertical distance traveled by the handle between the closed position and the open position divided by a horizontal distance traveled by the first sliding member between the initial position and the engaged position.

15. A chassis system comprising:
a chassis; and
a retractable handle assembly positioned in the chassis, the retractable handle assembly comprising:
a base plate having a base plane;
a first sliding member having a first ramp surface and a first wedge surface, the first sliding member being movable along a first axis that is parallel to the base plane, each of the first ramp surface and the first wedge surface being angularly oriented relative to the base plane, the first ramp surface being angled to receive a first force, the first force being angled perpendicularly relative to and towards the base plane, the first sliding member moving along the first axis in response to the first force; and
a handle having a first mating wedge surface, the handle being movable along a second axis that is perpendicular to the base plane, the first wedge surface being movable towards the first mating wedge surface in response to the first force, movement of the first wedge surface towards the first mating wedge surface causing a second force that deploys the handle to move from a closed position to an open position.

16. The chassis system of claim 15 further comprising:
an electronic device detachably positioned in the chassis, the electronic device having a weight-bearing member adapted to couple to the retractable handle assembly and generate the first force.

17. The chassis system of claim 16:
wherein the weight-bearing member includes a shaft pin; and
wherein the handle assembly further includes a cover that extends at least in part parallel to the first axis, the cover having a recess extending towards the base plane, the recess being adapted to receive the shaft pin.

18. The electronic system of claim 16, wherein the electronic device includes a graphics processing unit (GPU).

19. A method for disassembling an electronic device from an electronic chassis, the method comprising:
providing a retractable handle assembly detachably positioned in the electronic chassis, the retractable handle assembly includes:
a base plate having a base plane;
a sliding member having a ramp surface and a wedge surface, the sliding member being movable along a first axis that is parallel to the base plane, each of the ramp surface and the wedge surface being angularly oriented relative to the base plane, the ramp surface being angled to receive a first force, the first force being angled perpendicularly relative to and towards the base plane, the sliding member moving along the first axis in response to the first force; and
a handle having a mating wedge surface, the handle being movable along a second axis that is perpendicular to the base plane, the wedge surface being movable towards the mating wedge surface in response to the first force, movement of the wedge surface towards the mating wedge surface causing a second force that deploys the handle to move from a closed position to an open position;
deploying the handle by exerting the first force against the ramp surface, the first force being provided by weight of the electronic device; and
lifting the handle to disassemble the retractable handle assembly and the electronic device from the electronic chassis.

20. The method of claim 19, wherein the deploying includes:
disconnecting the electronic device from a motherboard of the electronic chassis;
aligning a weight-bearing member of the electronic device with the ramp surface of the sliding member of the retractable handle assembly; and
providing the first force by exerting, via the weight-bearing member, weight of the electronic device against the first ramp surface of the first sliding member to cause the handle of the retractable handle assembly to move from the closed position to the open position.

* * * * *